US012283621B2

(12) United States Patent
Leendertz et al.

(10) Patent No.: US 12,283,621 B2
(45) Date of Patent: *Apr. 22, 2025

(54) SEMICONDUCTOR DEVICE HAVING A TRANSISTOR WITH TRENCHES AND MESAS

(71) Applicant: Infineon Technologies Austria AG, Villach (AT)

(72) Inventors: Caspar Leendertz, Munich (DE); Markus Beninger-Bina, Grosshelfendorf (DE); Matteo Dainese, Munich (DE); Alice Pei-Shan Leendertz, Unterhaching (DE); Christian Philipp Sandow, Haar (DE)

(73) Assignee: Infineon Technologies Austria AG, Villach (AT)

( * ) Notice: Subject to any disclaimer, the term of this patent is extended or adjusted under 35 U.S.C. 154(b) by 169 days.

This patent is subject to a terminal disclaimer.

(21) Appl. No.: 18/109,997

(22) Filed: Feb. 15, 2023

(65) Prior Publication Data

US 2023/0197828 A1 Jun. 22, 2023

Related U.S. Application Data

(60) Continuation of application No. 17/144,193, filed on Jan. 8, 2021, now Pat. No. 11,610,976, which is a
(Continued)

(30) Foreign Application Priority Data

Dec. 14, 2017 (DE) .......................... 102017129955.6

(51) Int. Cl.
H01L 29/66 (2006.01)
H01L 29/06 (2006.01)
(Continued)

(52) U.S. Cl.
CPC .... H01L 29/66348 (2013.01); H01L 29/0696 (2013.01); H01L 29/083 (2013.01);
(Continued)

(58) Field of Classification Search
CPC ........... H01L 29/66348; H01L 29/0696; H01L 29/083; H01L 29/1095; H01L 29/404;
(Continued)

(56) References Cited

U.S. PATENT DOCUMENTS 7,800,168 B2 9/2010 Ogura et al.
9,076,838 B2 7/2015 Laven et al.
(Continued)

FOREIGN PATENT DOCUMENTS

CN 104518015 A 4/2015
DE 102014109475 A1 1/2015
(Continued)

OTHER PUBLICATIONS

Takahashi, H., et al., "Carrier Stored Trench-Gate Bipolar Transistor (CSTBT)—A Novel Power Device for High Voltage Application", 8th International Symposium on Power Semiconductor Devices and ICs, ISPSD '96 Proceedings, May 1996, pp. 349-352.

Primary Examiner — Thanhha S Pham
(74) Attorney, Agent, or Firm — Murphy, Bilak & Homiller, PLLC

(57) ABSTRACT

A semiconductor device includes a transistor that has: a drift region of a first conductivity type in a semiconductor substrate having a first main surface; a body region of a second conductivity type between the drift region and the first main surface; a plurality of trenches in the first main surface and patterning the semiconductor substrate into a plurality of mesas including a first mesa and a plurality of dummy mesas, the plurality of trenches including an active trench and a plurality of dummy trenches arranged in a row;
(Continued)

a gate electrode arranged in the active trench; and a source region of the first conductivity type in the first mesa. The first mesa is arranged adjacent to the active trench. A dummy mesa is arranged between each adjacent pair of the dummy trenches. The dummy mesas do not carry load current during an on-state of the transistor.

20 Claims, 23 Drawing Sheets

Related U.S. Application Data division of application No. 16/219,108, filed on Dec. 13, 2018, now Pat. No. 10,923,578.

(51) Int. Cl.
| | | |
|---|---|---|
| *H01L 29/08* | (2006.01) | |
| *H01L 29/10* | (2006.01) | |
| *H01L 29/40* | (2006.01) | |
| *H01L 29/417* | (2006.01) | |
| *H01L 29/739* | (2006.01) | |

(52) U.S. Cl.
CPC ........ *H01L 29/1095* (2013.01); *H01L 29/404* (2013.01); *H01L 29/407* (2013.01); *H01L 29/417* (2013.01); *H01L 29/7396* (2013.01); *H01L 29/7397* (2013.01)

(58) Field of Classification Search
CPC . H01L 29/407; H01L 29/417; H01L 29/7396; H01L 29/7397; H01L 29/0619; H01L 29/10; H01L 29/0684
See application file for complete search history.

(56) References Cited

U.S. PATENT DOCUMENTS

| | | | |
|---|---|---|---|
| 9,871,128 | B2 | 1/2018 | Udrea et al. |
| 11,610,976 | B2 * | 3/2023 | Leendertz ............ H01L 29/417 |
| 2013/0009205 | A1 | 1/2013 | Tsuzuki et al. |
| 2013/0221427 | A1 | 8/2013 | Siemieniec et al. |
| 2015/0102404 | A1 | 4/2015 | Meiser et al. |
| 2015/0179636 | A1 | 6/2015 | Pfirsch et al. |
| 2015/0349103 | A1 | 12/2015 | Onozawa et al. |
| 2016/0254376 | A1 | 9/2016 | Corvasce |
| 2016/0336393 | A1 | 11/2016 | Kim et al. |
| 2017/0271445 | A1 | 9/2017 | Udrea et al. |
| 2017/0271488 | A1 | 9/2017 | Udrea et al. |
| 2019/0237545 | A1 | 8/2019 | Suzuki |

FOREIGN PATENT DOCUMENTS

| | | |
|---|---|---|
| DE | 102014119278 A1 | 6/2015 |
| DE | 102014119603 A1 | 7/2015 |
| DE | 102014119543 A1 | 6/2016 |
| JP | 2004039838 A | 2/2004 |
| JP | 2011199061 A | 10/2011 |
| JP | 2012151470 A | 8/2012 |
| JP | 2015072950 A | 4/2015 |
| WO | 2009122486 A1 | 10/2009 |

* cited by examiner

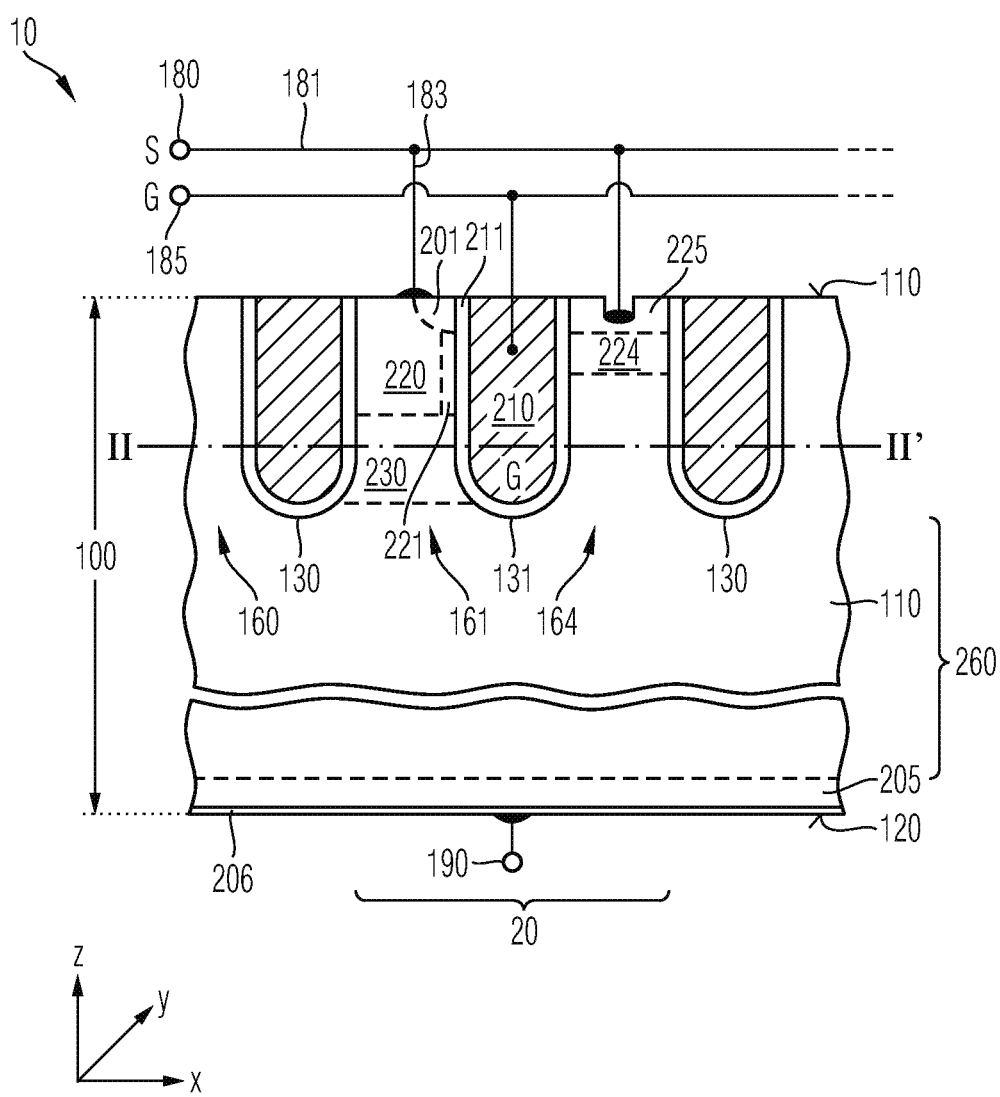

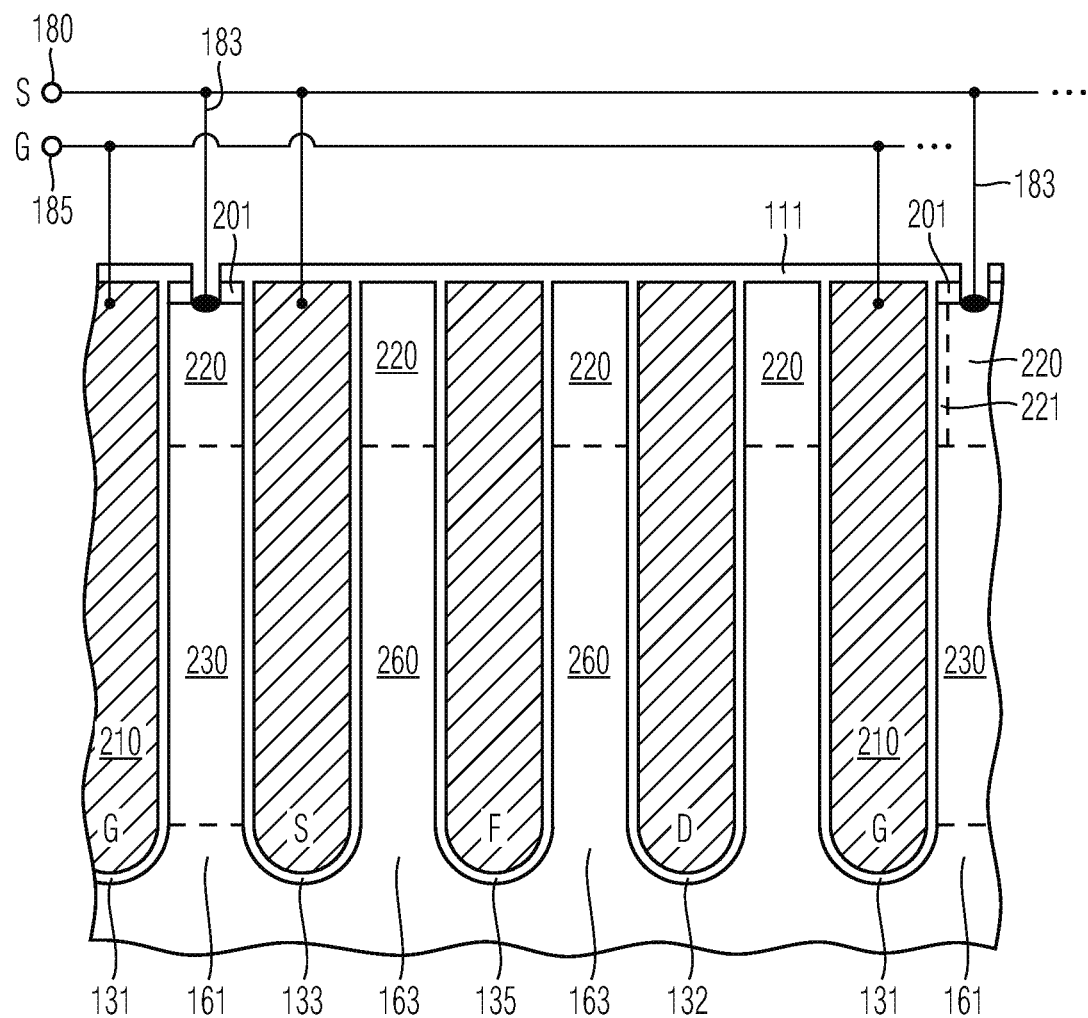

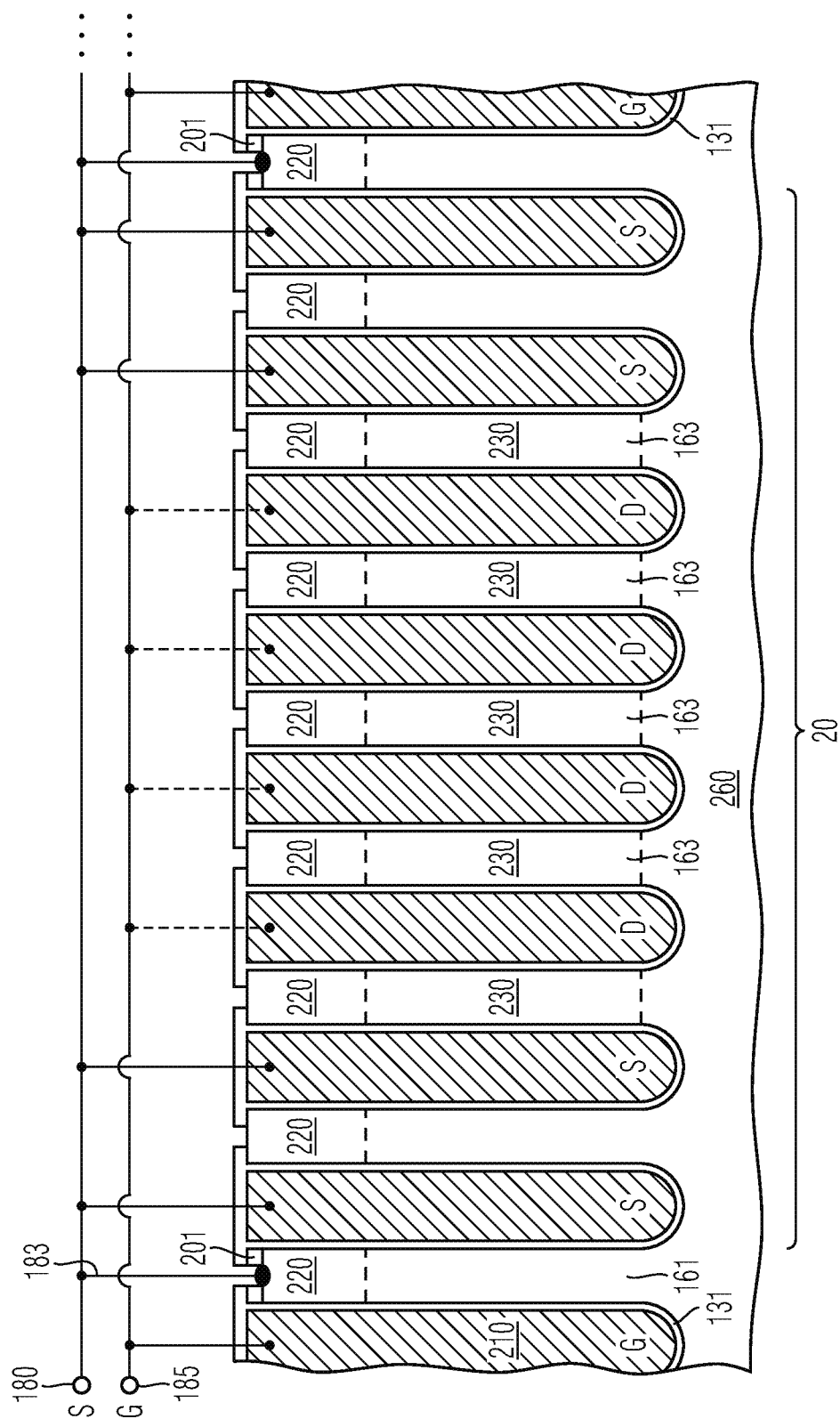

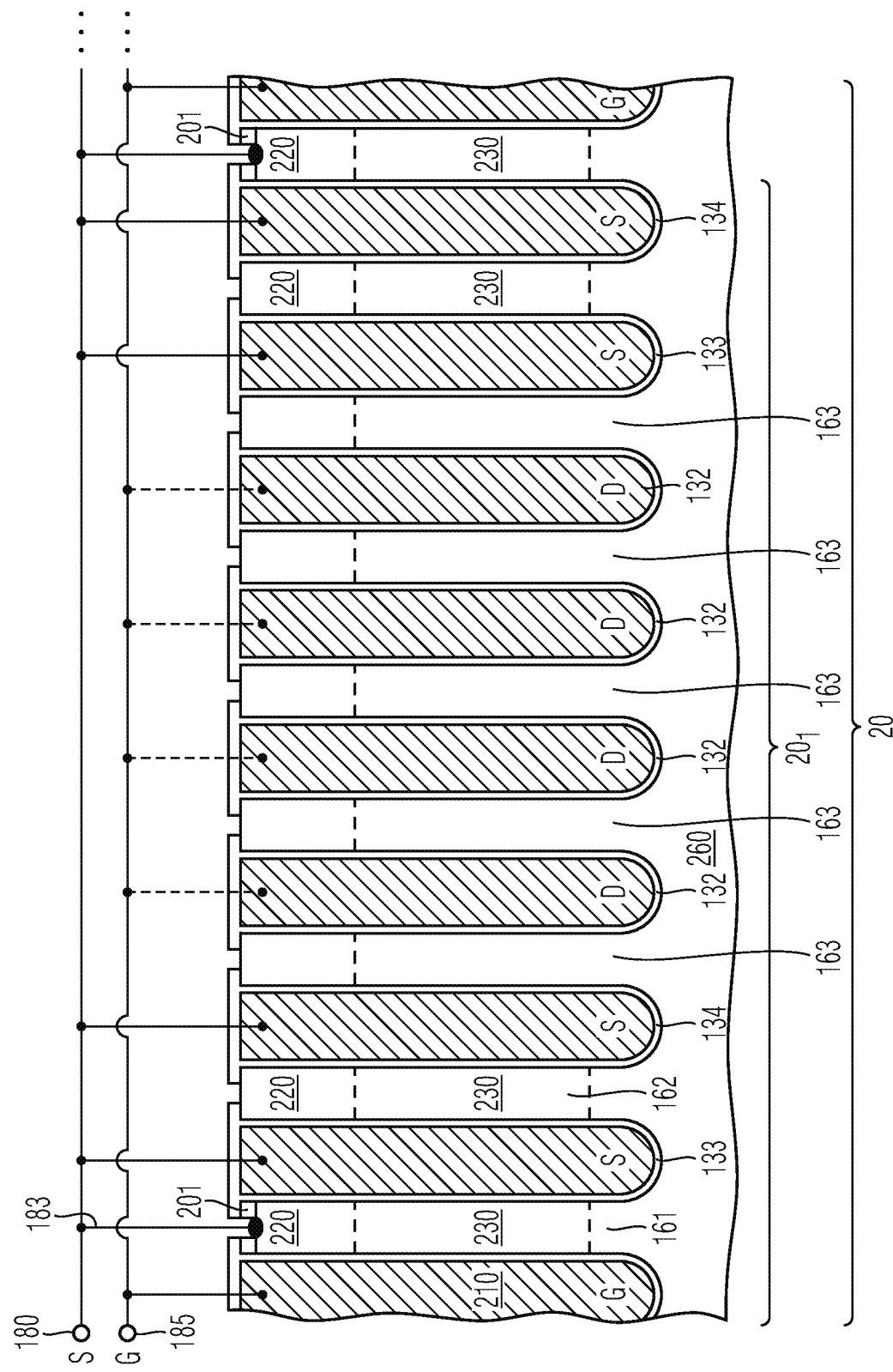

SEMICONDUCTOR DEVICE HAVING A TRANSISTOR WITH TRENCHES AND MESAS

BACKGROUND

Bipolar semiconductor devices such as insulated-gate bipolar transistors (IGBTs) are suitable for use as power switches. For example, an IGBT may be used as an electronic switch for switching an electrical load. For instance, IGBTs may be used as power switches in motor drive inverters, as well as in direct-current (DC) to DC power converters. Attempts are being made to improve operating parameters of semiconductor devices.

It is desirable to provide an improved semiconductor device.

SUMMARY

According to embodiments, a semiconductor device comprises a transistor. The transistor comprises a drift region of a first conductivity type in a semiconductor substrate having a first main surface, a body region of a second conductivity type between the drift region and the first main surface, and a plurality of trenches in the first main surface. The trenches pattern the semiconductor substrate into a plurality of mesas comprising a first mesa and a dummy mesa. The plurality of trenches comprise at least one active trench, wherein the first mesa is arranged at a first side of the active trench and the dummy mesa is arranged at a second side of the active trench. The transistor further comprises a gate electrode arranged in the active trench, and a source region of the first conductivity type in the first mesa. A one-sided channel of the transistor is configured to be formed in the first mesa.

For example, a width of the first mesa is less than 1 μm, e.g. less than 700 nm or even less than 500 nm. For example, the width of the first mesa may correspond to the distance between adjacent trenches.

According to embodiments, the source region may be electrically connected to a source terminal via a source contact. Further, the dummy mesa may be connected to the source terminal via a contact having a higher resistance than the source contact at least for carriers of a first conductivity type.

According to embodiments, the transistor may further comprise a barrier region of the first conductivity type having a higher doping concentration than the drift region. The first barrier region is arranged between the body region and the drift region. The barrier region is arranged in at least one of the first mesa and the dummy mesa.

For example, the first barrier region may be arranged in the first mesa and may be absent from the dummy mesa. Alternatively, the first barrier region may be arranged in the dummy mesa and may be absent from the first mesa.

By way of example, the plurality of trenches may further comprise a first and a second source trenches and a further trench between the first and the second source trenches. A conductive material arranged in the first and second source trenches may be electrically connected to a source terminal, respectively. Dummy mesas may be arranged between each of the first and second source trenches and the further trench. The barrier region may be arranged in the dummy mesas between each of the first and second source trenches and the further trench. According to a specific implementation, at least one of the dummy mesas or, e.g. a first one and a second one of the dummy mesas may be arranged so as to be in contact with the first and the second source trenches, respectively. The dummy mesas may further be arranged on either sides of the further trench.

The trenches may further comprise a floating trench. A conductive material arranged in the floating trench may be electrically disconnected from the gate terminal and from the source terminal.

According to further embodiments, a semiconductor device comprises a transistor. The transistor comprises a drift region of a first conductivity type in a semiconductor substrate having a first main surface, a body region of a second conductivity type between the drift region and the first main surface, and a plurality of trenches in the first main surface. The trenches pattern the semiconductor substrate into a plurality of mesas comprising dummy mesas. The plurality of trenches comprise a dummy trench. Dummy mesas are arranged on either sides of the dummy trench. The plurality of trenches further comprise an active trench. A first mesa is arranged adjacent to a first side of the active trench. One of the dummy mesas is arranged adjacent to a second side of the active trench. The transistor further comprises a gate electrode arranged in the active trench and a source region of the first conductivity type in the first mesa. The transistor still further comprises a barrier region of the first conductivity type at a higher doping concentration than the doping concentration of the drift region. The barrier region is arranged between the body region and the drift region. The barrier region is arranged in at least one of the dummy mesas.

For example, the barrier region may be absent from the first mesa and from the dummy mesa that is adjacent to the second side of the active trench.

According to embodiments, a semiconductor device comprises a transistor. The transistor comprises a drift region of a first conductivity type in a semiconductor substrate having a first main surface, a body region of a second conductivity type between the drift region and the first main surface, and a plurality of trenches in the first main surface. The trenches pattern the semiconductor substrate into a plurality of mesas comprising a first mesa. The plurality of trenches comprise an active trench and a first and a second source trenches, a conductive material in the first and second source trenches being connected to a source terminal. The transistor further comprises a gate electrode arranged in the active trench, and a source region of the first conductivity type in the first mesa. The first mesa is arranged adjacent to the active trench. The transistor further comprises a second mesa between the first and second source trenches, the second mesa being in contact with at least one of the first and the second source trenches. The transistor still further comprises a barrier region of the first conductivity type at a higher doping concentration than the doping concentration of the drift region. The barrier region is arranged between the body region and the drift region and the barrier region is arranged in the second mesa. A vertical size s of the barrier region is at least twice a width of the second mesa.

For example, the plurality of trenches may further comprise a dummy trench between the first source trench and the second source trench. For example, dummy mesas being arranged on either sides of the dummy trench.

According to embodiments, a width of the first mesa may be less than 1 μm. The first mesa may be arranged between the active trench and the first source trench. By way of example, the first mesa may be in contact with at least one of the active trench and the first source trench.

A conductive material in the dummy trench may be electrically connected to the source terminal.

According to embodiments, a semiconductor device comprises a transistor. The transistor comprises a drift region of a first conductivity type in a semiconductor substrate having a first main surface, a body region of a second conductivity type between the drift region and the first main surface, and a plurality of trenches in the first main surface. The trenches pattern the semiconductor substrate into a plurality of mesas comprising a first mesa and a second mesa. The plurality of trenches comprise an active trench. A gate electrode is arranged in the active trench. The transistor further comprises a source region of the first conductivity type in at least one of the first mesa and the second mesa. The transistor still further comprises a first barrier region of the first conductivity type at a higher doping concentration than the doping concentration of the drift region. The first barrier region is disposed between the body region and the drift region. The first barrier region is disposed in the first mesa. The transistor further comprises a second barrier region of the first conductivity type having a lower doping concentration than the first barrier region and having a higher doping concentration than the drift region. The second barrier region is disposed between the body region and the drift region. The second barrier region is disposed in the second mesa.

For example, the source region may be arranged in the first and the second mesas.

According to embodiments, the second mesa may be a dummy mesa.

According one or more embodiments, an electric device comprises the semiconductor device as described above and an element connected to semiconductor device. For example, the element may be one of a motor and a logic circuit.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

FIGS. 1D and 1E show vertical cross-sectional views of a portion of a semiconductor device according to one or more further embodiments, respectively.

FIG. 7B shows a cross-sectional view of a portion of a semiconductor device according to still further examples.

FIG. 7C shows a cross-sectional view of a portion of a semiconductor device according to still further examples.

FIG. 7D shows a cross-sectional view of a portion of a semiconductor device according to still further examples.

DETAILED DESCRIPTION

Figure 1A:
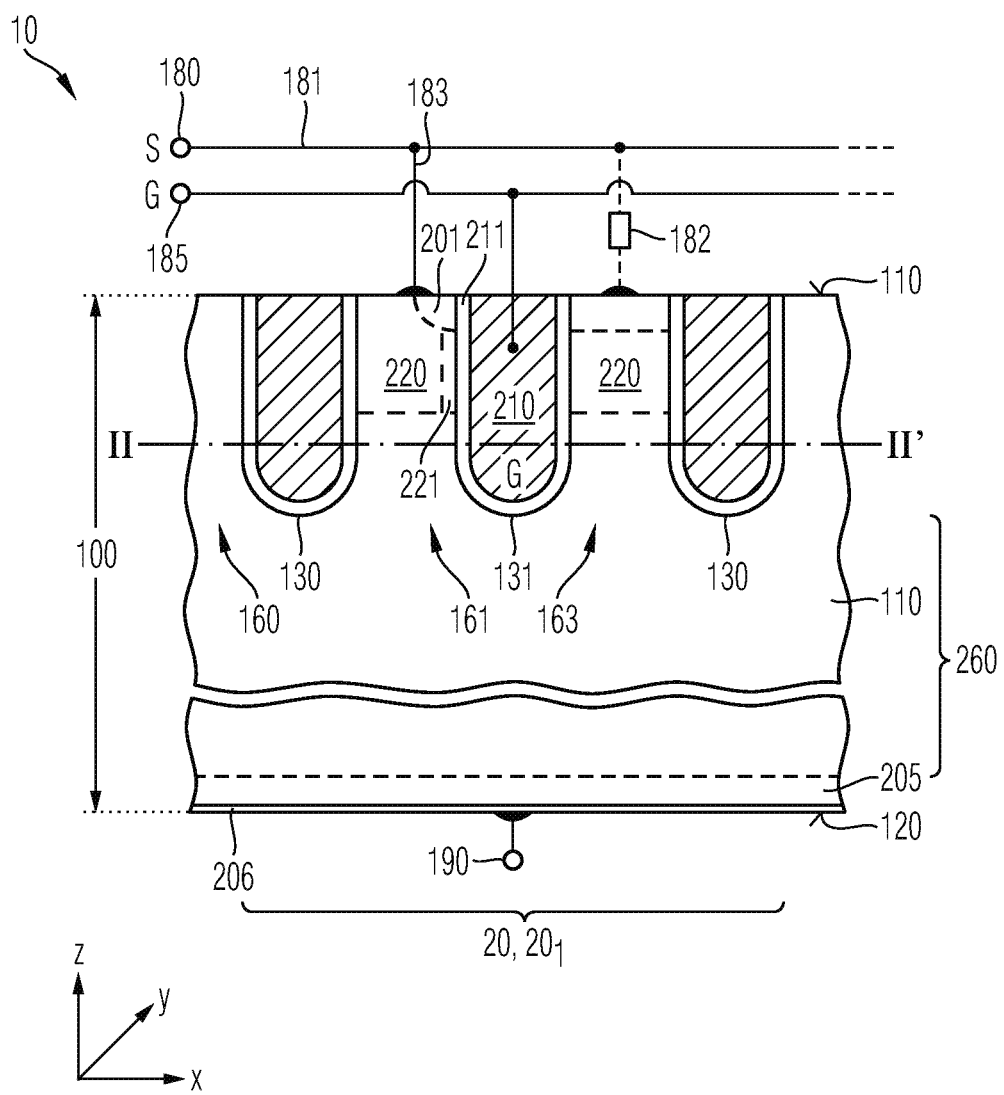
FIGS. 1A and 1B show vertical cross-sectional views of a portion of a semiconductor device according to one or more embodiments, respectively.

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to other embodiments, silicon carbide (SiC) or gallium nitride (GaN) may form the semiconductor substrate material.

The term "vertical" as used in this specification intends to describe an orientation which is arranged perpendicular to the first surface of the semiconductor substrate or semiconductor body.

The terms "lateral" and "horizontal" as used in this specification intends to describe an orientation parallel to a first surface of a semiconductor substrate or semiconductor body. This can be for instance the surface of a wafer or a die.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The term "electrically connected" intends to describe a low-ohmic electric connection between the elements electrically connected together.

The Figures and the description illustrate relative doping concentrations by indicating "−" or "+" next to the doping type "n" or "p". For example, "n$^-$" means a doping concentration which is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting.

In the following, embodiments will be described. As is to be noted, specific implementations, features and descriptions of functionality discussed with reference to a certain Figure may also be applied to the further Figures unless indicated otherwise or unless evidently inappropriate.

FIG. 1A shows a cross-sectional view of a portion of a semiconductor device 10 in a semiconductor substrate 100 having a first main surface 110. The semiconductor device 10 comprises a transistor 20. The transistor 20 comprises a drift region 260 of a first conductivity type and a body region 220 of a second conductivity type between the drift region 260 and the first main surface 110. The transistor 20 further comprises a plurality of trenches 130 in the first main surface 110. The trenches 130 pattern the semiconductor substrate 100 into a plurality of mesas 160. The mesas 160 comprise a first mesa 161 and a dummy mesa 163. The plurality of trenches 130 comprises at least one active trench 131. According to the example shown in FIG. 1A, the first mesa 161 is arranged at a first side of the active trench 131 and the dummy mesa is arranged at a second side of the active trench 131. The transistor 20 further comprises a gate electrode 210 in the active trench 131. The transistor 20 further comprises a source region 201 of the first conductivity type in the first mesa 161. The source region 201 may be electrically connected to a source terminal 180 via a source contact 183. A one-sided channel 221 of the transistor 20 is configured to be formed in the first mesa 161.

Generally, upon application of a predetermined voltage between the gate terminal and the source terminal 180, that is, when the gate is turned on, an inversion layer (conductive channel) is formed. If the source region and the drift zone are of the first conductivity type, e.g. n type and the body region is of the second conductivity type, e.g. p type, the conductive channel is formed for the (majority) carriers of the first conductivity type, e.g. electrons in the case for n type. The conductive channel is formed in the body region 220 at a portion adjacent to the gate electrode 210. By varying the gate voltage, the conductivity of the channel may be controlled.

According to embodiments, a transistor may comprise a plurality of transistor cells 201, each having the basic structure explained in this disclosure. The transistor cells may be disposed adjacent to each other. The transistor cells may be connected in parallel to each other to form a transistor cell array. For example, source regions of the transistor cells may be electrically connected to a common terminal. Further, gate electrodes of the transistor cells may be electrically connected to a common gate terminal. Moreover, the back side regions 205 of the transistor cells may be electrically connected to a common terminal.

Within the present disclosure, the term "dummy mesa" may mean a mesa which is not used for the purpose of carrying the load current during the on-state of the transistor. According to embodiments, each transistor cell 201 may comprise a first mesa 161 and at least one inactive or dummy mesa 163. For example, a controllable conductive channel may not be configured to be formed. For example, a transition between a first load terminal, e.g. the source terminal 180 and the dummy mesa 163 may provide an electric insulation at least for charge carriers of the first conductivity type.

By way of example, the transistor 20 or transistor cell 201 may be configured to prevent a load current from passing said transition between the dummy mesa 163 and the corresponding load terminal, e.g. the source terminal 180. According to examples, the dummy mesa 163 does not allow for inducing an inversion channel. To be more specific, according to examples and in contrast to the first mesa 161, the dummy mesa 163 does not conduct the load current during the conducting state of the transistor. For example, the dummy mesa 163 may be considered as a decommissioned mesa that is not used for the purpose of carrying the load current.

Figure 7A:
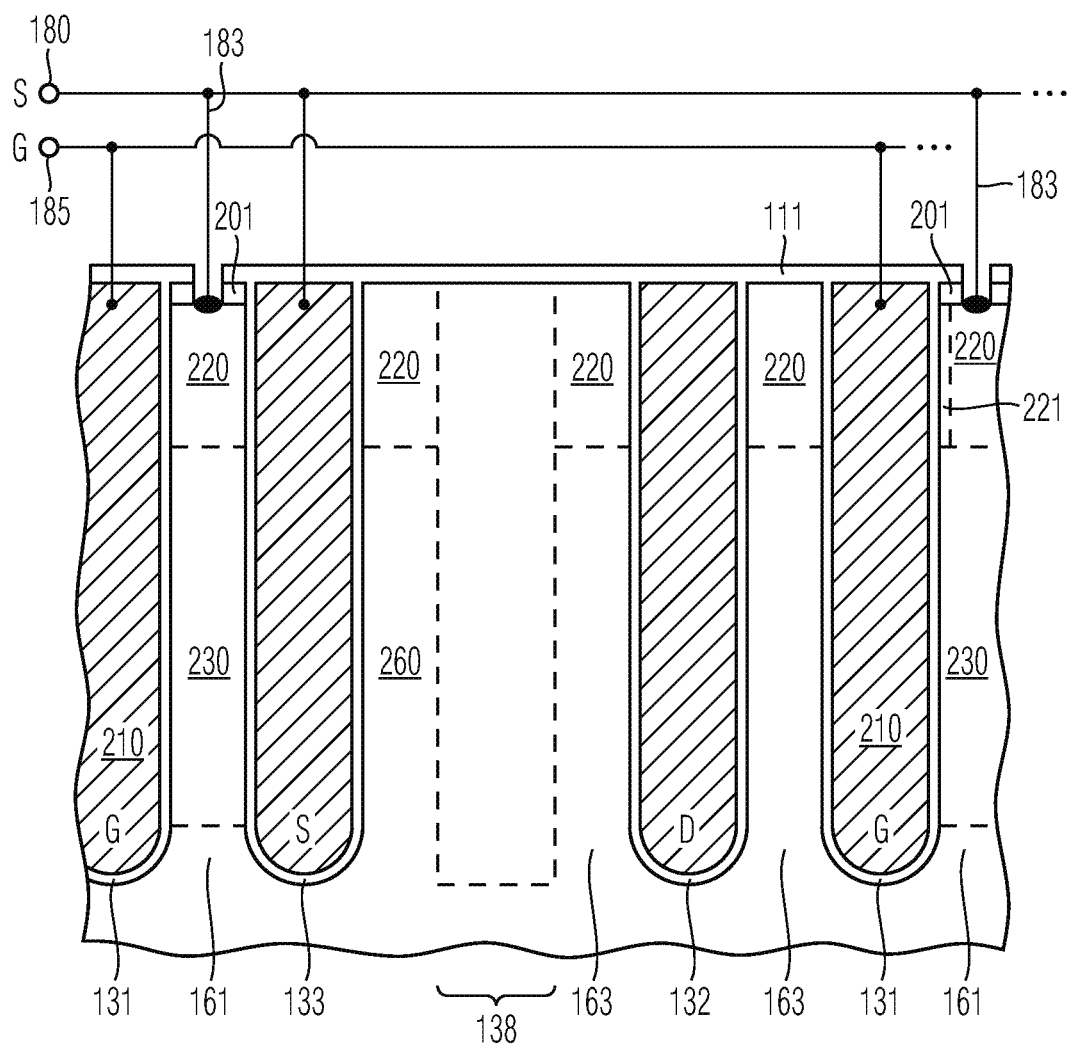
FIG. 7A shows a cross-sectional view of a portion of a semiconductor device according to still further examples.

According to an implementation, the dummy mesa 163 is not electrically connected to e.g. a corresponding load terminal, e.g. the source terminal 180 but is electrically insulated from the source terminal 180, e.g. by means of an insulation layer 111 (illustrated in FIGS. 7A and 7B). For example, the transition between the corresponding load terminal and the dummy mesa 163 may be implemented in a manner so as to provide an electrical insulation not only for charge carriers of the first conductivity type, i.e. majority carriers, but also for charge carriers of the second conductivity type, i.e. minority carriers. According to this implementation, the dummy mesa 163 may not comprise a source region 201. Further or alternatively, the dummy mesa 163 may not comprise a channel region. Further or alternatively, the dummy mesa 163 may not be contacted by a contact plug such as a low-ohmic contact. According to this implementation, the term "dummy mesa" may refer to a mesa in which no current at all passes a transition between the mesa and a corresponding load terminal, e.g. the source terminal 180.

According to a further implementation, the dummy mesa 163 may be electrically connected to a corresponding load terminal, e.g. the source terminal 180 by a transition which provides an electrical insulation only for charge carriers of the first conductivity type but not for charge carriers of the second conductivity type. To be more specific, according to this implementation, the dummy mesa may allow a current of charge carriers of the second conductivity type, e.g. a hole current to pass the transition. For example, depending on an electrical potential of an electrode in a trench adjacent to the dummy mesa 163, such hole current may only temporarily present. For example, this hole current may be present shortly before carrying out a turn-off operation, e.g. in order to reduce the total charge carrier concentration present in the semiconductor body.

According to a further implementation, the dummy mesa may be implemented in a manner that a conductive channel is not configured to be formed, the conductivity of the conductive channel being controllable e.g. by means of an electrode in a trench adjacent to the dummy mesa.

As has been explained above, the dummy mesa may be implemented by the mesa being disconnected from the source terminal 180. According to further embodiments, this expression may mean that the dummy mesa is connected to the source terminal 180 via a contact having a higher resistance, e.g. ohmic resistance than the source contact 183 at least for (majority) carriers of a first conductivity type, e.g. electrons. As will be explained with reference to FIGS. 1D and 1E, the term "dummy mesa" may also refer to a mesa that blocks carriers of the first conductivity type, e.g. electrons, but allows for a limited current of carriers of the second conductivity type, e.g. holes.

According to these examples, a source region may be arranged in the dummy mesa. Further, a body region of the second conductivity type may be arranged in the dummy mesa. According to further examples, a source region 201 may be absent from the dummy mesa 163. According to further embodiments, the body region of the second conductivity type may not be arranged in the dummy mesa.

According to examples, the dummy mesa 163 comprising or not comprising a source region 201 may be electrically connected to the source terminal 180 via a resistor element 182 having a resistance covering the whole spectrum between several 10 Ohms up to insulating. For example, the resistance of the resistor element may be configured to be sufficiently well disconnected from the first load terminal, e.g. the source terminal that during a switching event its potential is decoupled from the first load terminal on a time scale of said switching event, e.g. 10 ns, or 100 ns, or 10 µs. To be more specific, the resistance of the resistor element 182 may be selected that the potential of the source region does not correspond to the source potential when a fast switching process is performed. For example, a switching time of a fast switching process may be less than e.g. 10 µs, more specifically less than 100 ns or 10 ns. For example, the resistor element 182 may be implemented by a conductive line having a certain resistance. According to embodiments, the resistance of the resistor element 182 may be determined by the layout of the semiconductor device. According to further embodiments, the feature that the dummy mesa is connected to the source terminal 180 via a contact having a higher resistance than the source contact 183 may mean that the dummy mesas are electrically connected to the source terminal only outside the cell array region or that the contact areas for making contact to the dummy mesa are considerably smaller than for the source regions in the active mesa by at least a factor of 10.

The term "a one-sided channel of the transistor is configured to be formed in the first mesa" is intended to mean that in operation, when the source region, the drain region and the gate electrode are electrically connected to the respective terminals, an inversion layer (conductive channel) is formed at only one side of the mesa, whereas an inversion layer is not formed at the other side of the mesa. For example, this may be due to the fact that a source region is arranged at one side of the mesa, while a source region is not arranged at the other side of the mesa. For example, this may be implemented by an isolated source contact that forms a contact only at one side of the mesa. According to further embodiments, a gate electrode may be arranged at one side of the mesa, whereas a gate electrode is absent from the other side of the mesa. For example, a trench adjacent to the other side of the mesa may include an insulating material or a conductive material electrically connected to the source terminal.

The term "active trench" as used in the context of the present disclosure is intended to mean a trench comprising a gate electrode, wherein a conductive channel is configured to be formed in semiconductor material adjacent to at least one sidewall of the active trench. This may, for example, be the case when a source region is adjacent to at least one sidewall of the active trench, the source region being electrically connected to the source terminal.

The term "gate trench" as used in the context of the present disclosure is intended to mean a trench comprising a gate electrode electrically connected to a gate terminal. It is left open whether a conductive channel is configured to be formed adjacent to both sides of the gate trench. For example, a dummy mesa may be arranged adjacent to a first side of the gate trench, and source region may be absent from a second side of the gate trench.

The term "the first mesa is arranged at a first side of the active trench and the dummy mesa is arranged at a second side of the active trench" is intended to mean that the first mesa and the dummy mesa do not necessarily contact the same trench. For example, one or more further trenches may be arranged between the active trench and the dummy mesa.

As will be explained below with reference to FIG. 6F, a configuration in which first mesas are adjacent to a first and a second sidewall of an active trench, respectively, further comprising a dummy mesa is configured to be encompassed by the wording "the first mesa is arranged at a first side of the active trench and the dummy mesa is arranged at a second side of the active trench". By way of example, this configuration may further comprise a source trench, wherein the dummy mesa is arranged on a side of the source trench remote from the active trench.

According to the specific embodiments illustrated in FIG. 1A, the first mesa 161 may be arranged adjacent to a first side of the active trench 231 and the dummy mesa 163 may be arranged adjacent to a second side of the active trench 231.

The cross-sectional view of FIG. 1A is taken along a first direction, e.g. the x direction. The trenches 130 have a longitudinal axis extending in a second direction, e.g. in the y direction.

The semiconductor device 10 described in the context of the present specification generally relates to an IGBT formed in the semiconductor substrate 100. A source region 201 of the first conductivity type (e.g. n-type) is disposed adjacent to the first main surface 110. A back side region 205 of the second conductivity type is disposed adjacent to the second main surface 120. For example, the back side region 205 which is also referred to as an emitter, may be of the second conductivity type. According to embodiments, the back side region 205 may comprise portions of the second conductivity type and may further comprise portions of the first conductivity type. According to embodiments, there may be stripe-shapes portions of the first conductivity type and stripe-shaped portions of the second conductivity type. The transistor 20 comprises the drift region 260, the body region 220, the source region 201 and the back side region 205. The transistor further comprises an active trench 131 that is formed in the first main surface 110 and which extends to the drift region 260. A dielectric layer 211 may be disposed adjacent to the sidewalls and the bottom side of the active trench 131. The gate dielectric layer 211 insulates the gate electrode 210 from adjacent semiconductor material.

The source region 201 is electrically connected to the source terminal 180, for example my means of a source conductive layer 181 that is connected to the source contacts 183. The back side region 205 is electrically connected to a back side terminal 190, e.g. via a back side electrode 206 that may be implemented by a back side conductive (metallization) layer.

When a predetermined voltage $V_{CE}$ is applied between the back side terminal 190 and the source terminal 180, and a predetermined voltage is applied between the gate terminal and the source terminal 180, that is, when the gate is turned on, an inversion layer (conductive channel) is formed in the body region 220 at a portion adjacent to the gate electrode 210. When the conductive channel is formed, for example, in case of the source region being n-doped, electrons may flow from the source region 201 to the drift region 260. Holes may move from the back side region 205 into the drift region 260. This results in a great reduction of resistance of the drift region 260 due to a conductivity modulation which increases the current capacity of the IGBT. A voltage drop between the back side terminal 190 and the source terminal 180 of the IGBT at this time is referred to as an on state voltage ($V_{CE,SAT}$). The on state voltage $V_{CE,SAT}$ indicates losses of the semiconductor device.

When the gate is turned off, i.e. the gate voltage $V_{GE}$ between the gate terminal 185 and the source terminal 180 is reduced to zero or reverse-bias, no inversion layer is formed in the body region 220. Accordingly, the flow of electrons from the source region 201 stops. Thereafter, the electrons and holes accumulated in the drift region 260 either move to the back side region 205 and the source region 201, respectively, or recombine to disappear.

It is to be noted that the above explanation has been given for a specific constellation of n- and p-doped regions. As is clearly to be understood, the concept may be modified so that the function of electrons and holes is reversed.

According to one or more embodiments, the trenches 130, 131 may extend in a y-direction, i.e. in a direction intersecting or perpendicular to the depicted plane of the cross-section. Transistors or transistor cells of the IGBT may comprise gate trenches 131 in which a gate electrode 210 is arranged. The transistors or transistor cells may comprise further trenches, e.g. trenches filled with a conductive material that is electrically coupled to the source terminal 180 or that is otherwise connected or in a floating state. A dielectric layer may be arranged in the trenches 130. For example, the dielectric layer may insulate the conductive material from adjacent semiconductor material. According to embodiments, a thickness of the dielectric layer may be uniform in the trenches 130. According to further embodiments, the thickness may vary. For example, the thickness at a bottom part of the trenches may be larger than the thickness at the sidewalls of the trenches. Generally, the trenches may be arranged at a regular pitch. This will be further explained with reference to FIG. 6C. Mesas 160 may be arranged between adjacent trenches 130. For example, the mesas may comprise a first mesa 161 and a dummy mesa 163.

According to embodiments, an active trench 131 is arranged between a first mesa 161 in which a one-sided channel 221 of a transistor is configured to be formed and a dummy mesa 163. As a result, a width of the mesa may be reduced in comparison to cases of a double-sided mesa. Further, one side of the mesa is not used as a channel or, differently stated, a portion of the width of the mesa is inactive and is not used as a channel. As a consequence, an improved confinement of carriers may be achieved resulting in an improved $V_{CE,\,SAT}$.

According to embodiments, a source trench may be arranged adjacent to a first mesa. In this case, due to the presence of the source trench, the gate-source capacitance may be adjusted in an improved manner. Further, this may improve the trade-off between switching losses/controllability/$V_{CE,\,SAT}$ in dependence from width of the mesa.

According to embodiments shown in FIG. 1A, the dummy mesa 163 may be arranged in direct contact with the active trench 131.

The mesas may further comprise a second mesa 162 (not illustrated in FIG. 1A) which may be electrically connected to the source terminal 180, e.g. via a source region 201.

Figure 1B:
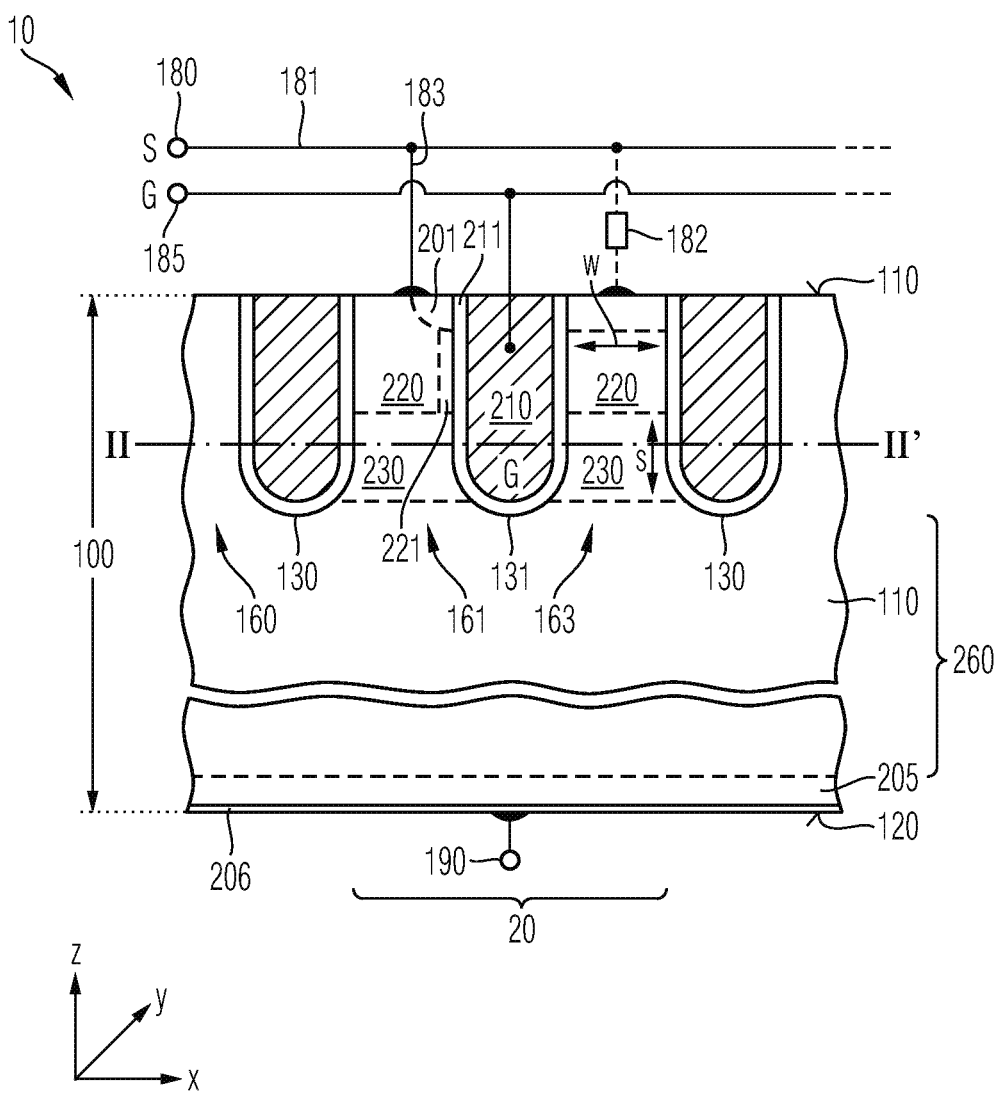

According to embodiments described with reference to FIG. 1B, the semiconductor device 10 further comprises a barrier region 230 of the first conductivity type at a higher doping concentration than the doping concentration of the drift region 260. The barrier region 230 is disposed between the body region 220 and the drift region 260 and is in contact with the drift region 260. The barrier region 230 is arranged in at least one of the first mesa and the dummy mesa.

For example, a ratio between the doping concentration of the barrier region 230 and the doping concentration of the drift region 260 may be 100 to 10000. When the doping concentration of the drift region 260 varies, the ratio may be the ratio between the doping concentration of the barrier region 230 and the highest doping concentration of the drift region 260. According to embodiments, the barrier region 230 is arranged in direct contact with the drift region 260. For example, an interface between the barrier region 230 and the drift region 260 forms a junction between portions of identical doping types having different doping concentrations, e.g. an $n^+n$ or a $p^+p$ junction.

According to one or more embodiments, the barrier region may be patterned, e.g. the barrier region may not be homogeneously disposed between the drift region 260 and the body region 220. Instead, the barrier region may be disposed in certain areas of the transistor 20. For example, the barrier region 230 may be arranged in selected ones of the mesas 160 and may be absent from further ones of the mesas 160. The barrier region 230 is formed in direct contact with the drift region 260. The barrier region 230 forms a pn junction to the body region 220. The barrier region 230 may extend from one sidewall of the mesa to another sidewall of the mesa in a horizontal direction. In more detail, at least in portions the barrier region 230 completely fills the mesa between adjacent trenches in a horizontal cross-section. For example, the barrier region may be arranged in the first mesa 161 and may be absent from the dummy mesa 163. According to further embodiments, the barrier region may be arranged in the dummy mesa 163 and may be absent from the first mesa 161.

Figure 1C:
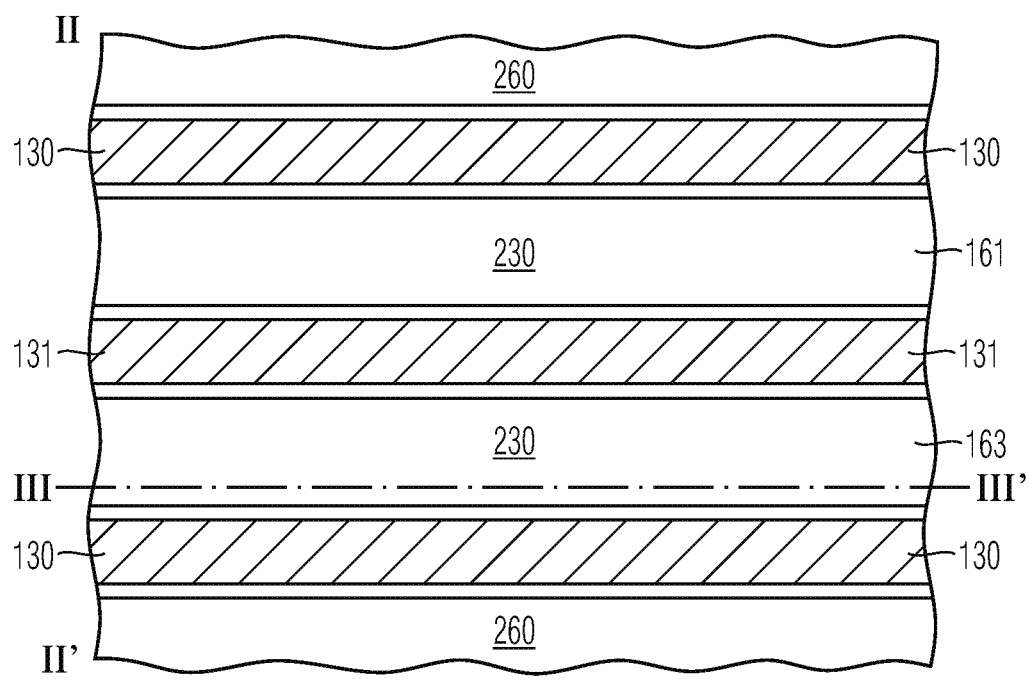
FIG. 1C shows a horizontal cross-sectional view of a portion of a semiconductor device according to one or more embodiments.
Figure 1C:
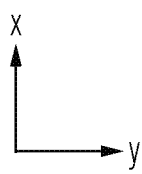

FIG. 1C shows a horizontal cross-sectional view of the semiconductor device. For example, the horizontal cross-sectional view of FIG. 1C may be taken between II and II' as is also indicated in FIG. 1A. As is shown, the trenches 130 have a longitudinal axis extending along the second direction.

Figure 1D:
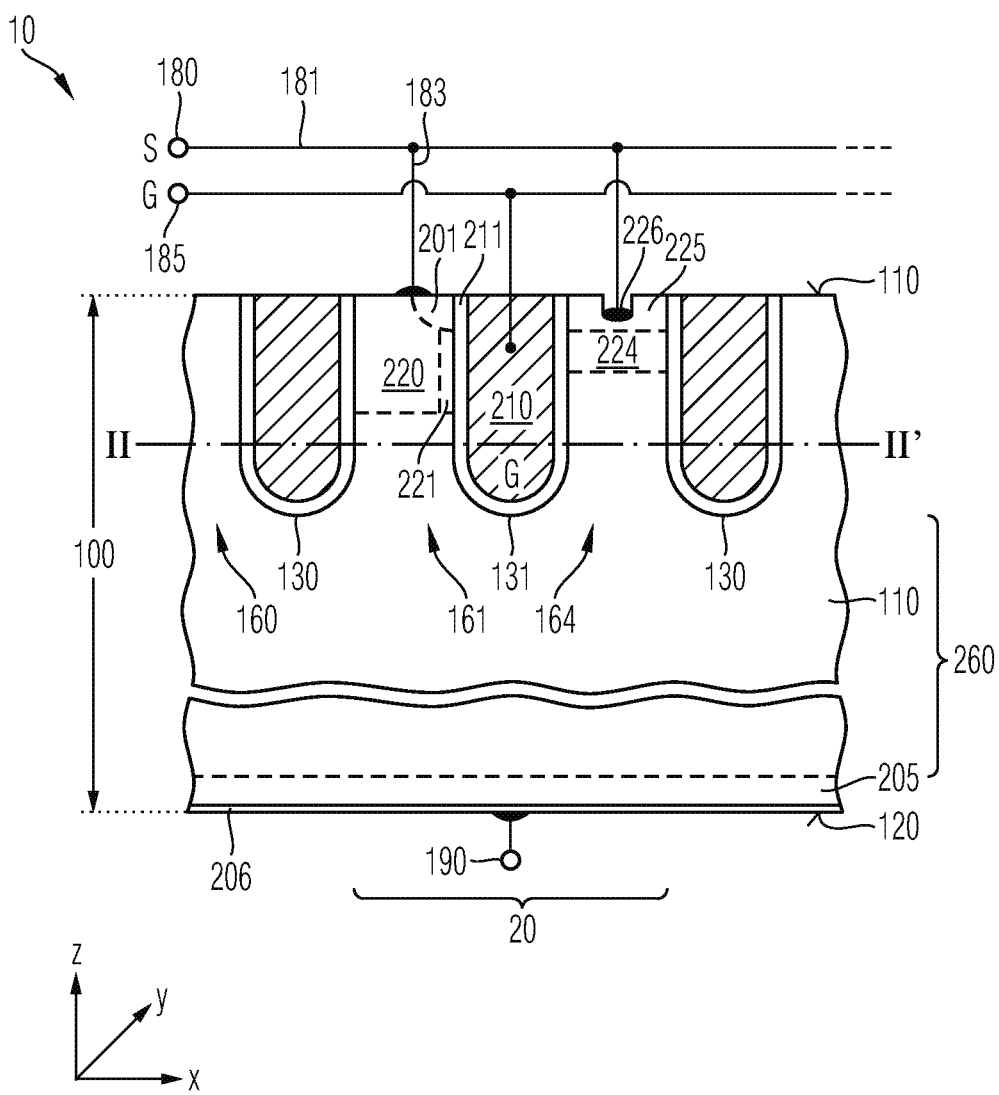

FIG. 1D shows a cross-sectional view of a portion of a semiconductor device according to further embodiments. Differing from the embodiments illustrated in FIG. 1A, the dummy mesa 164 may be implemented so as to block carriers of the first conductivity type e.g. electrons and to allow for limited hole current during turn-on and in the on-state. By way of example, the mesa 164 may comprise a second doped region 225 of the second conductivity type adjacent to a mesa contact 226 that may be electrically connected to the source terminal. The mesa 164 may further comprise a first doped region 224 of the first conductivity type that is arranged between the second doped region 225 and the drift region 260.

According to examples, the second doped region 225 may be a shallow high dose implanted region, e.g. a p-implanted region. The second doped region 225 may block the carriers of the first conductivity type. Further, the first doped region 224 may be doped at a lower doping concentration than the second doped region 225. The first doped region 224 may implement a barrier to carriers of the second conductivity type, e.g. holes. A doping concentration of the first doped region 224 may be set to balance $V_{ce,sat}$ requirements and requirements for reduced hole current feedback.

Due to this special implementation, the mesa 164 provides a low resistive current path for carriers of the second conductivity type, e.g. holes at a desired point of time during switching such that the current feedback during turn-on is reduced and the dU/dt and the dI/dt controllability is improved. Furthermore, since an increased fraction of the overall current is carried by holes, the coupling between the gate and the overall current, which is normally given by the transfer characteristics of the first mesa, is reduced. This may result in a reduced gate-overshoot and may lower dU/dt. According to further implementations, the resistivity of the hole current path is balanced or changed with time, such that the plasma concentration in the device remains high in the on state. According to further embodiments, a current in this mesa 164, may not be controlled with a special gate driver.

According to embodiments illustrated in FIG. 1E, the semiconductor device 10 may further comprise a barrier region 230 in the first mesa 161. For example, the barrier region 230 may extend to a deeper depth than the first doped region 224. According to embodiments, the barrier region 230 may extend from a position in an upper third or fourth of the adjacent active trench 131 to a lower third or fourth of the active trench 131.

The specific implementation of the dummy mesa 164 discussed with reference to FIGS. 1D and 1E can be applied to any structures or semiconductor devices comprising a dummy mesa as described herein. The beneficial effects of the special implementation of the dummy mesa 164 will be present in semiconductor devices in which a first mesa 161 is adjacent to a first side of the active trench 131, and the dummy mesa 164 is adjacent to a second side of the active trench 131.

Figure 2:
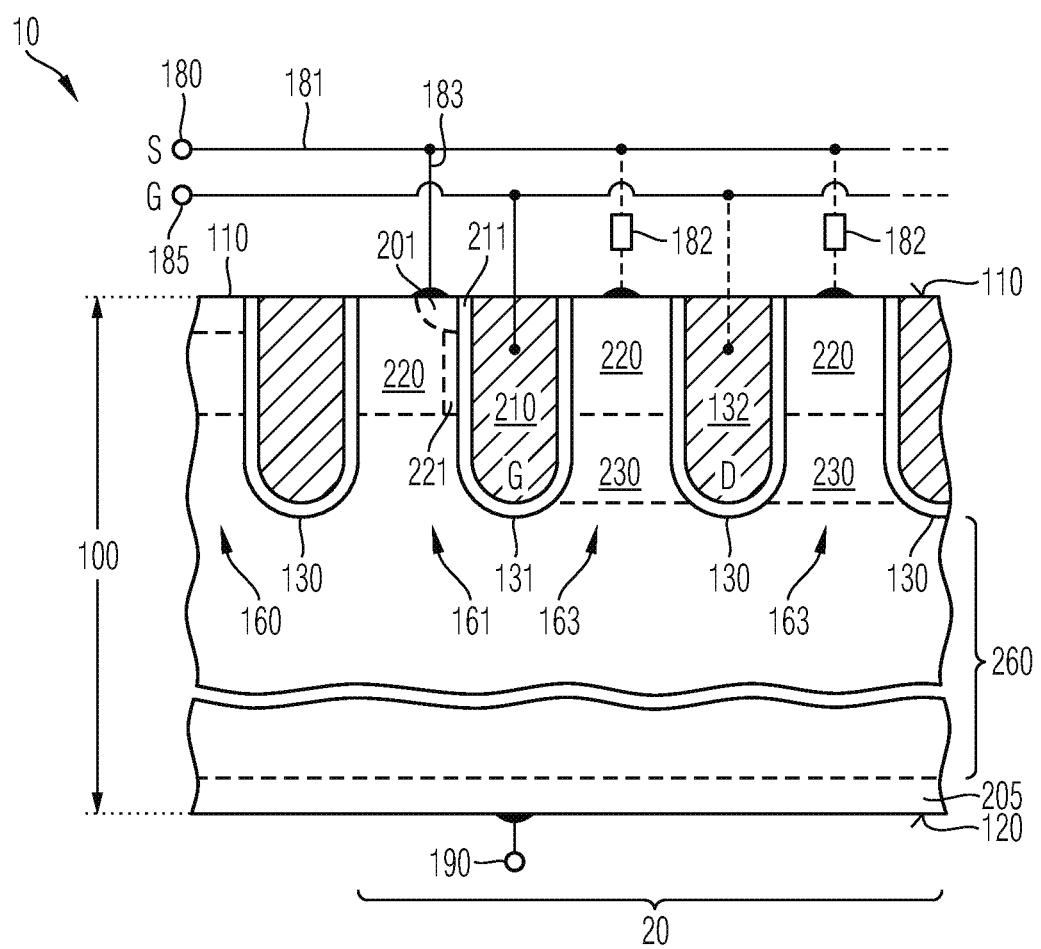
FIG. 2 is a vertical cross-sectional view of a portion of a semiconductor device according to one or more embodiments.

FIG. 2 shows a cross-sectional view of a portion of a semiconductor device according to one or more further embodiments. The semiconductor device 10 of FIG. 2 is formed in a semiconductor substrate 100 having a first main surface 110. The semiconductor device 10 comprises a transistor 20. The transistor 20 comprises a drift region 260 of a first conductivity type and a body region 220 of a second conductivity type between the drift region 260 and the first main surface 110. The transistor 20 comprises a plurality of trenches 130 in the first main surface 110. The trenches 130 pattern the semiconductor substrate 100 into a plurality of mesas 160 comprising dummy mesas 163. The plurality of trenches comprise an active trench 131. A first mesa is arranged adjacent to an active trench. The transistor further comprises a gate electrode 210 in the active trench 131 and a source region 201 of the first conductivity type in the first mesa 161. The source region 201 in the first mesa 161 is electrically connected to a source terminal 180 via a source contact 183. The plurality of trenches 130 further comprise a dummy trench 132. Dummy mesas 163, 164 are arranged on either sides of the dummy trench 132. The transistor 20 further comprises a barrier region 230 of the first conductivity type at a higher doping concentration than the doping concentration of the drift region 260. The barrier region 230 is disposed between the body region 220 and the drift region 260. The barrier region 230 is arranged in at least one of the dummy mesas 163.

As is illustrated in FIG. 2, the dummy mesas 163 may be disconnected from the source terminal 180 or may be connected via contacts to the source terminal. For example, the contacts may comprise resistor elements 182 having a high resistance as specified with respect to FIG. 1A. According to further embodiments, the dummy mesas may be implemented as mesas 164 as has been explained with reference to FIGS. 1D and 1E. The term "dummy trench" generally refers to a trench 132 adjacent to dummy mesas 163 on either sides thereof. An insulating material or a conductive material may be filled in the dummy trenches 132. For example, a conductive material in the dummy trenches may be electrically connected to the gate terminal 185. According to further embodiments, the conductive material in the dummy trench 132 may be disconnected from the gate terminal 185. According to still further embodiments, the conductive material in the dummy trench 132 may be electrically connected to the source terminal 180 or may be otherwise connected or may be in a floating state. The dummy mesas 163 may be adjacent to the active trench 131 on one side thereof. A first mesa 161 may be arranged at the other side of the active trench 131. Further elements of embodiments according to FIG. 2 are similar as those explained with reference to FIG. 1A. In particular, a one-sided channel 221 of the transistor is configured to be formed in the first mesa 161.

Figure 3A:
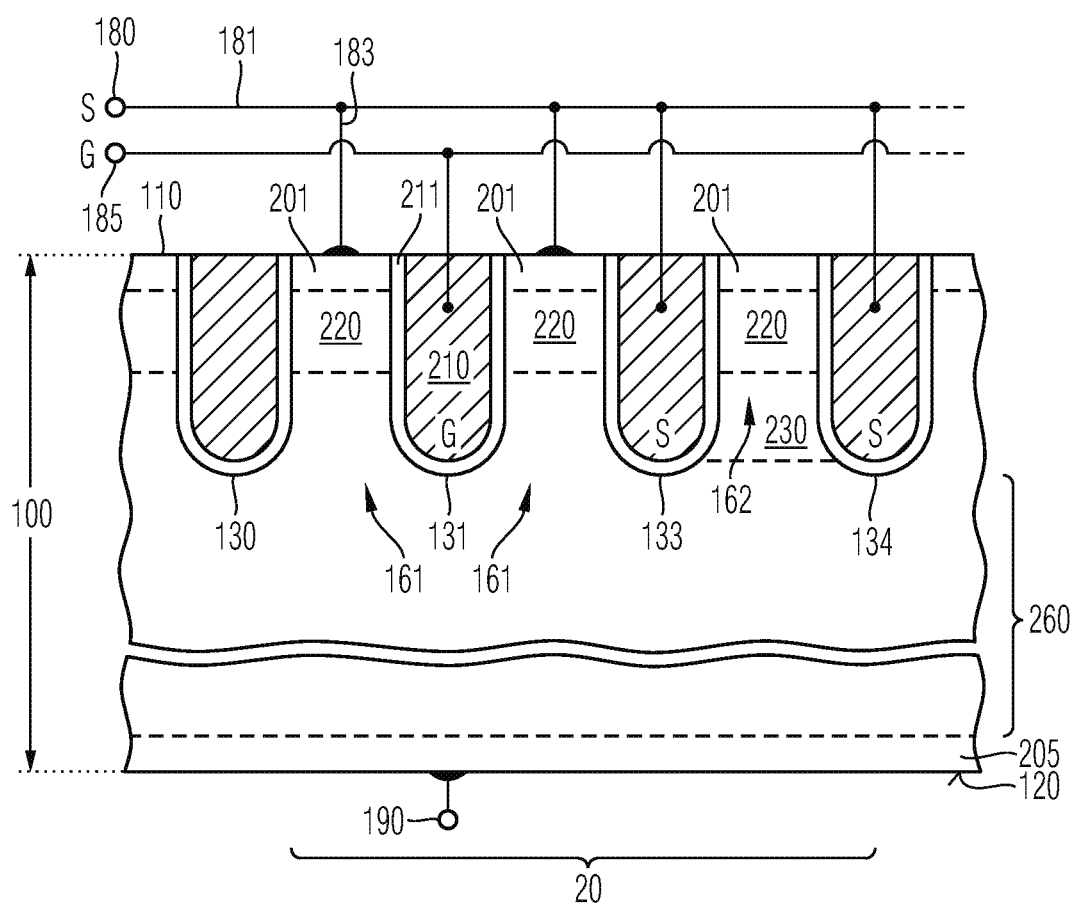
FIG. 3A is a cross-sectional view of a portion of a semiconductor device according to one or more embodiments.

FIG. 3A shows a cross-sectional view of a portion of a semiconductor device according to one or more further embodiments. The semiconductor device 10 of FIG. 3A is formed in a semiconductor substrate 100 having a first main surface 110. The semiconductor device 10 comprises a transistor 20. The transistor 20 comprises a drift region 260 of a first conductivity type and a body region 220 of a second conductivity type between the drift region 260 and the first main surface 110. The transistor 20 further comprises a plurality of trenches 130 in the first main surface 110. The trenches 130 pattern the semiconductor substrate 100 into a plurality of mesas 160 comprising a first mesa 161. The plurality of trenches 130 comprise an active trench 131 and a first and a second source trenches 133, 134. A conductive material in the first and second source trenches 133, 134 is connected to a source terminal 180. The transistor 20 comprises a gate electrode 210 arranged in the active trench 131. The transistor 20 further comprises a source region 201 of the first conductivity type in the first mesa 161. The first mesa 161 is arranged adjacent to the active trench 131. The semiconductor device further comprises a second mesa 162 arranged in contact with first and second source trenches 133, 134. The transistor 20 further comprises a barrier region 230 at a higher doping concentration than the doping concentration of the drift region. The barrier region 230 is disposed between the body region 220 and the drift region 260. The barrier region 230 is arranged in the second mesa 162. According to embodiments, the barrier region 230 may be arranged in the first mesa 161. According to further embodiments, the barrier region 230 may be absent from the first mesa 161. In the example shown in FIG. 3A, the first and second source trenches may be arranged adjacent to the active trench 131. For example, the first mesa 161 may be arranged between the active trench and the first source trench 133. The second mesa 162 is disposed between the first and second source trenches 133, 134. The semiconductor device explained with reference to FIG. 3A may comprise further source trenches wherein a conductive material in the further source trenches is electrically connected to the source terminal 180.

When, as is illustrated in FIG. 3A, a first mesa 161 is adjacent to a source trench 133, the gate-source-capacitance may be better adjusted, due to the presence of the source trench. Further, the trade-off between switching losses/controllability/$V_{CESAT}$ in dependence from mesa width may be improved.

Figure 3B:
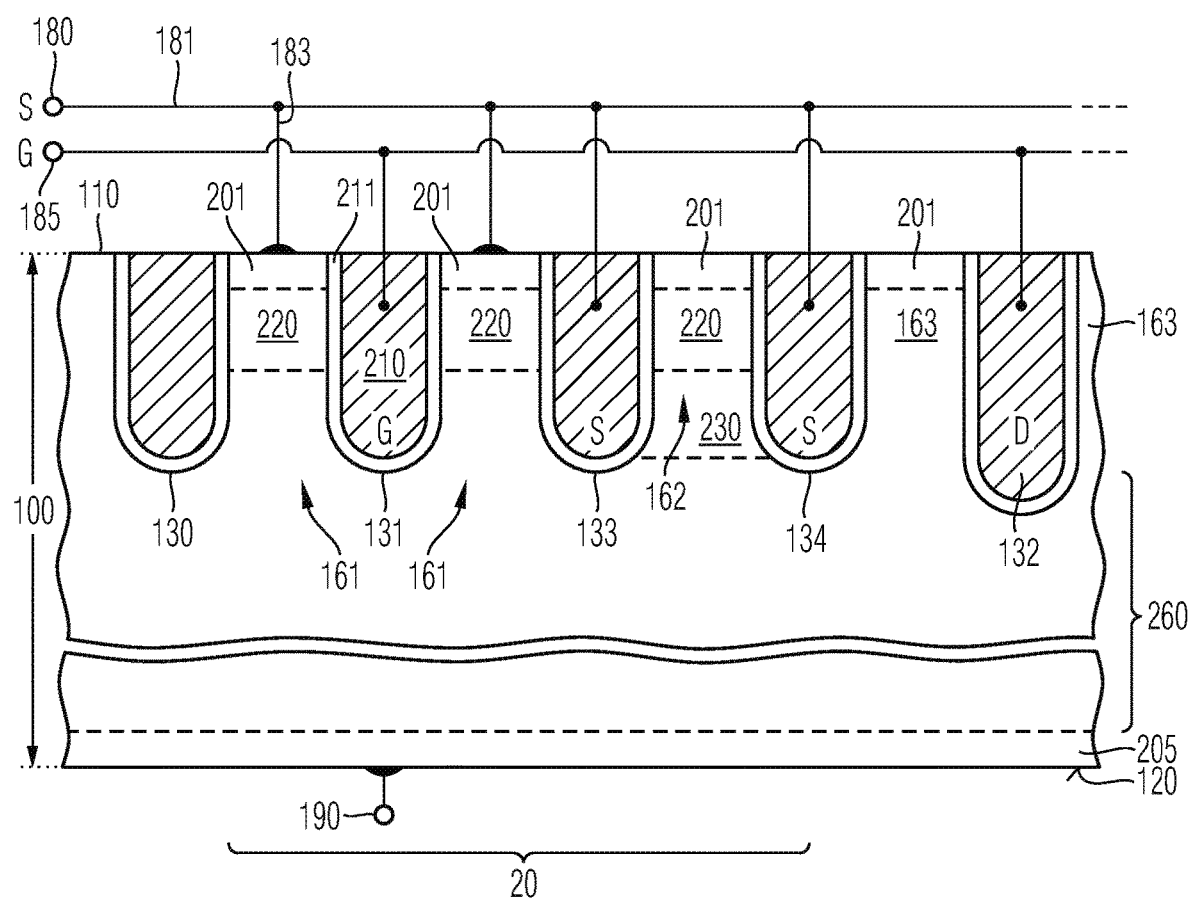
FIGS. 3B and 3C are cross-sectional views of a portion of a semiconductor device illustrating further modifications of the device shown in FIG. 3A, respectively.

According to embodiments illustrated with reference to FIG. 3B, in addition to the elements discussed with reference to FIG. 3A, the plurality of mesas further comprise two dummy mesas 163 and a dummy trench 132. The dummy mesas 163 are arranged on either sides of the dummy trench 132. Further, the dummy mesas 163 contact the dummy trench 132.

Figure 3C:
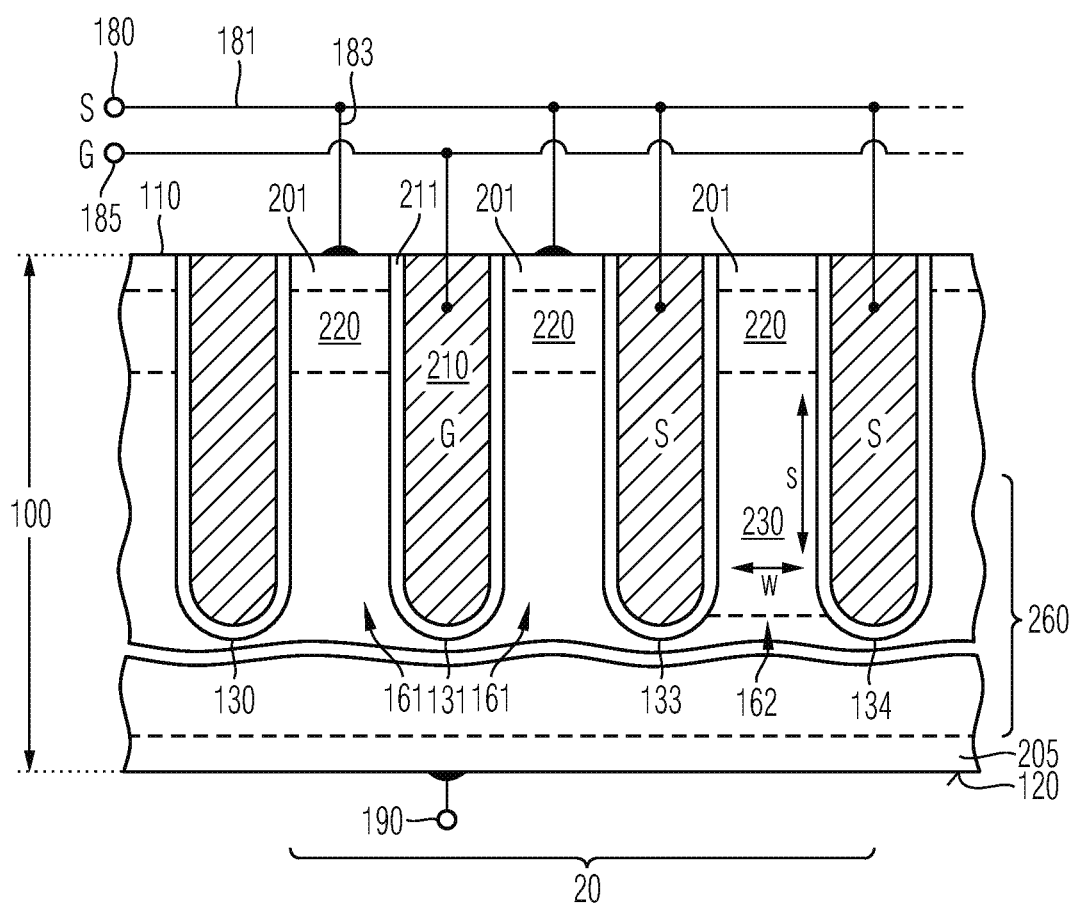

The semiconductor device of FIG. 3C is based on the semiconductor device of FIG. 3A. Further to the elements described with reference to FIG. 3A, a vertical size s of the barrier region 230 is at least twice a width w of the second mesa. The barrier region 230 vertically extends to a lower third or a lower fourth of the source trenches 133, 134. Optionally, the barrier region 230 may vertically extend to an upper third or an upper fourth of the source trenches 133, 134. According to further embodiments, the barrier region 230 may extend to a deeper depth than the source trenches 133, 134.

Figure 4:
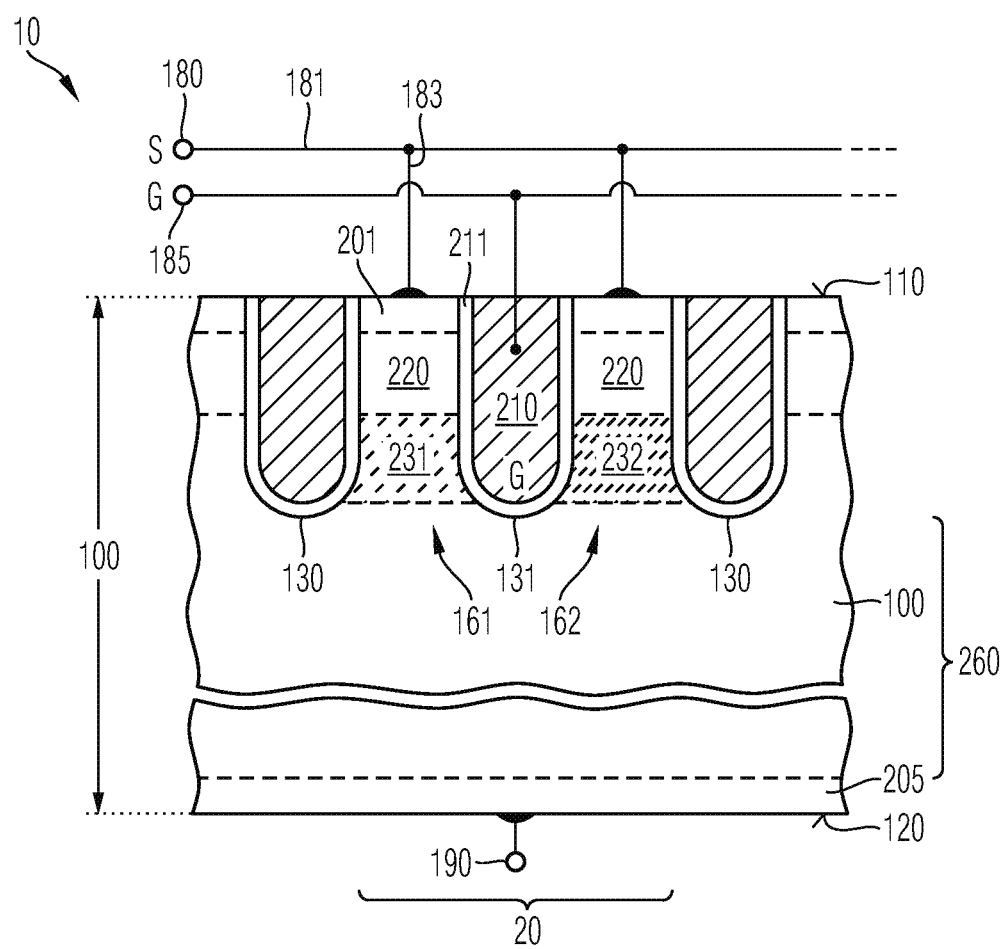
FIG. 4 is a cross-sectional view of a portion of a semiconductor device according to one or more embodiments.

FIG. 4 shows a cross-sectional view of a portion of a semiconductor device according to one or more further embodiments. The semiconductor device 10 is formed in a semiconductor substrate 100 having a first main surface 110. The semiconductor device 10 comprises a transistor 20. The transistor 20 comprises a drift region 260 of a first conductivity type, a body region 220 of a second conductivity type between the drift region 260 and the first main surface 110 and a plurality of trenches 130 in the first main surface 110. The trenches 130 pattern the semiconductor substrate 100 into a plurality of mesas 160 comprising a first mesa 161 and a second mesa 162. The plurality of trenches 130 comprise an active trench 131. A gate electrode 210 is arranged in the active trench 131. The transistor comprises a source region 201 of the first conductivity type in at least one of the first mesa 161 and the second mesa 162. The transistor 20 further comprises a first barrier region 231 of the first conductivity type at a higher doping concentration than the doping concentration of the drift region 260. The first barrier region 231 is disposed between the body region 220 and the drift region 260 in contact with the drift region. The first barrier region 231 is disposed in the first mesa 161. The transistor further comprises a second barrier region 232 of the second first conductivity type between the body region and the drift region 260 and in contact with the drift region 260. The second barrier region 232 is disposed in the second mesa 162. The second barrier region has a lower doping concentration than the first barrier region 231 and has a higher doping concentration than the drift region 260.

According to embodiments, a source region 201 may be arranged in the second mesa 162. According to further embodiments, the source region 201 may be absent from the second mesa 162. For example, the second mesa further may be a dummy mesa as has been explained above with reference to FIG. 1A, 1B, 1D or 1E. According to embodiments, the first mesa and the second mesa may be arranged adjacent to opposing sides of the active trench, respectively. According to further embodiments, the second mesa 162 may be disposed at an arbitrary position within the transistor 20.

Figure 5A:
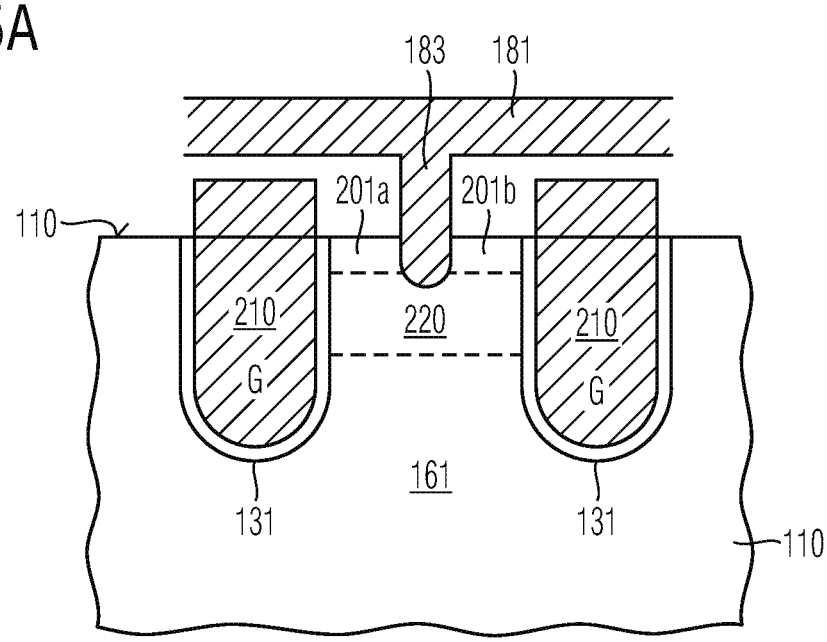
FIG. 5A is a cross-sectional view of a portion of a semiconductor device for explaining details thereof.

In the following, some details of the transistors will be discussed. FIG. 5A shows a cross-sectional view of a portion of a first mesa 161. For example, active trenches 131 may be disposed on either sides of the first mesa 161 and a gate electrode 210 may be arranged in the active trenches 131. The source region 201 is disposed in the first mesa 161. For example, the source region 201 may be arranged adjacent to a first main surface 110 of the semiconductor substrate. The source region 201 may be electrically connected via a source contact 183 to a source conductive layer 181 that may be electrically connected to a source terminal 180. Within the context of the present specification the term "a source region of the first conductivity type in the first mesa" is intended to mean that a source region 201 is arranged in the first mesa 161. For example, the source region 201 may comprise the first source region 201a arranged adjacent to the trench 130 on the left-hand side and a second source region 201b arranged adjacent to the trench 130 on the right-hand side. According to further embodiments the source region 201 may comprise only a first source region 201a arranged on the left-hand side of the first mesa 161 or only a second source region 201b arranged on the right-hand side of the first mesa 161. When the source region is e.g. implemented as a first source region 201a arranged on the right-hand side of the mesa or is implemented as a second source region 201b arranged on the left-hand side of the mesa, a one-sided channel 221 of the transistor is configured to be formed in the mesa.

Generally, the source contact 183 separates the first source region 201a from the second source region 201b. Nevertheless, it is clearly to be understood, that different connection schemes between the source conductive layer and the source region 201 may be implemented. The source contact 183 may be arranged so as to contact the body region 220 in order to suppress or deteriorate a parasitic bipolar transistor which could otherwise be formed in this area.

Figure 5B:
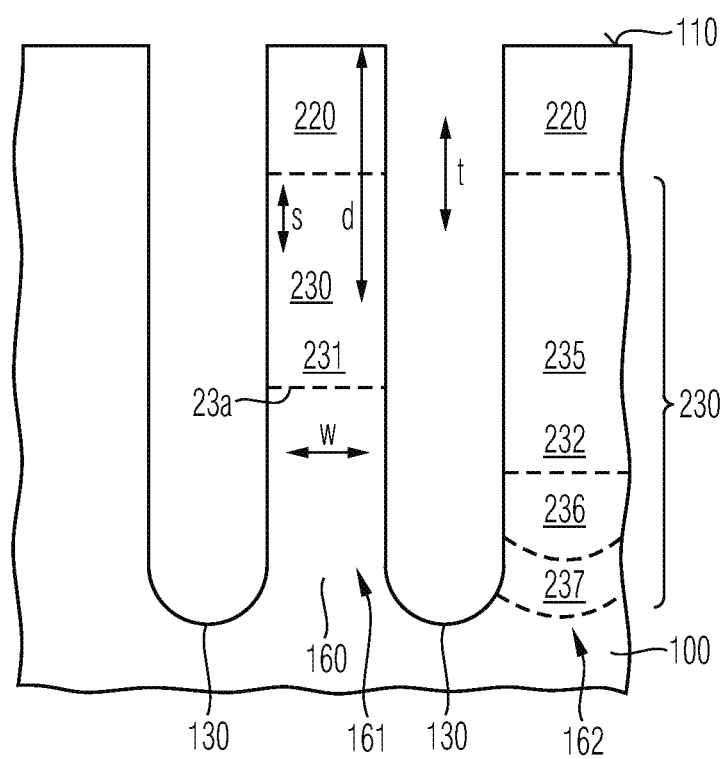
FIG. 5B is a cross-sectional view of a portion of a semiconductor device for explaining details thereof.

FIG. 5B schematically illustrates two trenches 130 and a barrier region 230 disposed in the mesa 160 between the trenches. For example, the trenches 130 may have a depth t measured between the main surface 110 of the semiconductor substrate and a bottom side of the respective trenches 130. A bottom side 230a of the barrier region 230 may be arranged at a distance d from the first main surface 110. The distance d may be smaller than the depth of the trenches t. According to further embodiments, the depth d may be approximately equal to the depth t of the trenches 130. Still further, the depth d may be larger than the depth t of the trenches 130. The width w of the mesas may be equal for different mesas. According to further embodiments, different mesas may have different widths, respectively. For example, a ratio of a width w of a mesa to a depth t of the trench may be 0.1 to 0.5. By setting the ratio of width w of the mesa to depth t of the trench the relationship between $V_{CE,SAT}$ and switching speed may be set. For example, when implementing low switching speeds, the width of the mesa may be small in comparison to the depth of the trench, which results in a low $V_{CE,SAT}$. On the other hand, when implementing a larger switching speed, a larger width of the mesa may result in an improved trade-off between $V_{CE,SAT}$ and switching speed.

The barrier region 230 may have a vertical size s that is at least twice the horizontal size of the barrier region 230.

The horizontal size of the barrier region may correspond to the width w of the corresponding mesa in which the barrier region 230 is arranged. According to further embodiments, a ratio of the vertical size of the barrier region s to the horizontal size of the barrier region or the width w of the corresponding mesa may be more than 3 or even more than 4. According to further embodiments, the barrier region 230 may extend to a lower portion of adjacent trenches. For example, the barrier region 230 may extend to a lower third or a lower fourth of an adjacent trench 130. Further, the barrier region 230 may extend from an upper third or an upper fourth of an adjacent trench 130. For example, one of the following relationships may be fulfilled by the depth d and the depth t: d>0.5×t or d>0.7×t or d>0.8×t.

As has been further indicated above, the doping concentration of the barrier regions may vary. For example, a first barrier region 231 having a first doping concentration may be arranged in a first mesa and a second barrier region 232 having a second doping concentration may be arranged in a second mesa 162. For example, the second doping concentration may be lower than the first lower doping concentration. According to further embodiments, the first mesa 161 and the second mesa 162 may have a different doping profile, respectively. For example, the doping profile of the second barrier region 232 may gradually vary towards a depth direction whereas the first doping profile results in an abrupt change of the doping concentration at the junction between drift region 260 and the second barrier region 232.

Generally, the barrier region, the first barrier region 231 and the second barrier region 232 have a higher doping concentration than the drift region 260, respectively. The doping concentration of the drift region 260 does not need to be constant within the drift region. For example, the doping concentration may increase from a side adjacent to the second main surface 120 towards the first main surface 110. For example, as is illustrated in FIG. 5B, barrier region, e.g. the second barrier region 232 may comprise different portions 235, 236, and 237, each having a different doping concentration. For example, the doping concentration of portion 237 may be larger than the doping concentration of the drift region 260. The doping concentration of portion 236 may be larger than the doping concentration of portion 237 and smaller than the doping concentration of portion 235.

In this context, the feature that the barrier region 230 has a higher doping concentration than the drift region 260 is intended to mean that the barrier region has a higher doping concentration than the highest value of the doping concentration within the drift region 260. When the barrier region 230 has a varying doping concentration, the lowest value of the doping concentration of the barrier region 230 may be larger than the highest value of the doping concentration of the drift region 260.

Figure 5C:
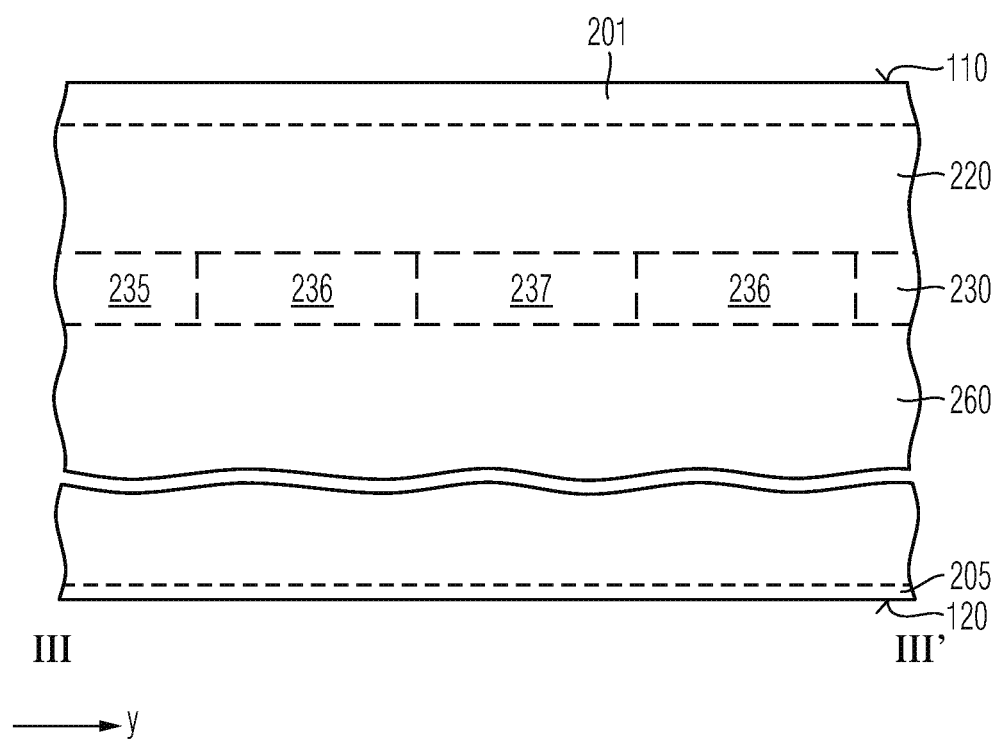
FIG. 5C is a vertical cross-sectional view of a portion of a semiconductor device, taken along the extension direction of trenches.

FIG. 5C shows a vertical cross-sectional view of a portion of a semiconductor device according to one or more embodiments. The cross-sectional view is taken between III and III' along an extension direction of the trenches 130, as is also indicated in FIG. 1B. As is illustrated, according to embodiments, the source region 201 may be continuously arranged along the extension direction of the mesas 160. For example, the mesa 160 may be a first mesa 161, a second mesa 162 or a dummy mesa 163. According to further embodiments, the source region 201 may not be continuous but may be arranged at specific positions only.

Independent from the specific implementation of the source region 201, the barrier region 230 may have a doping concentration that varies along the second direction. For example, as is indicated in FIG. 5C, the barrier region 230 may comprise portions 235, 236, and 237 having different doping concentrations that are arranged along the second direction.

As has been discussed, a barrier region may be arranged in some of the mesas. As a result, the switching speed, e.g. dU/dT may be set to a desired value. Generally, when power switches, in particular, IGBTs are used for switching sensitive elements, it may be advisable to set the switching speed to a low value in order to protect the sensitive device. For example, the switching speed may be set by setting the resistance of the gate electrode. The resistance of the gate electrode on the other hand influences the switching losses. Due to the presence of the barrier region, the controllability of the switching speed may be improved and the switching speed can be set to very low values. For example, the switching speed may be smaller than 10 V/ns, e.g. smaller than 5 V/ns. This may be useful in cases in which the semiconductor device comprises a plurality of trenches which are arranged at a small distance providing, e.g. a width of a mesa of less than 1 μm, more specifically less than 700 nm.

According to some embodiments, the barrier region 230 may be arranged adjacent to one side of an active trench 131. In this case a low $V_{ce,sat}$ may be achieved. Further, the hole current feedback on the gate may be modulated so that lower dU/dt switching speeds during turn-on are possible.

The basic elements discussed with reference to the FIGS. 1 to 4 may be applied in a variety of cases. According to embodiments, the elements such as trenches, e.g. source trenches, gate trenches and dummy trenches as well as the mesas may be arranged in a symmetric manner with respect to a first mesa, i.e. a mesa, the source region of which is electrically connected to the source terminal. According to further embodiments, these elements may be arranged in an asymmetric manner. For example, the elements may be arranged in an asymmetric manner with respect to an active trench.

Figure 6A:
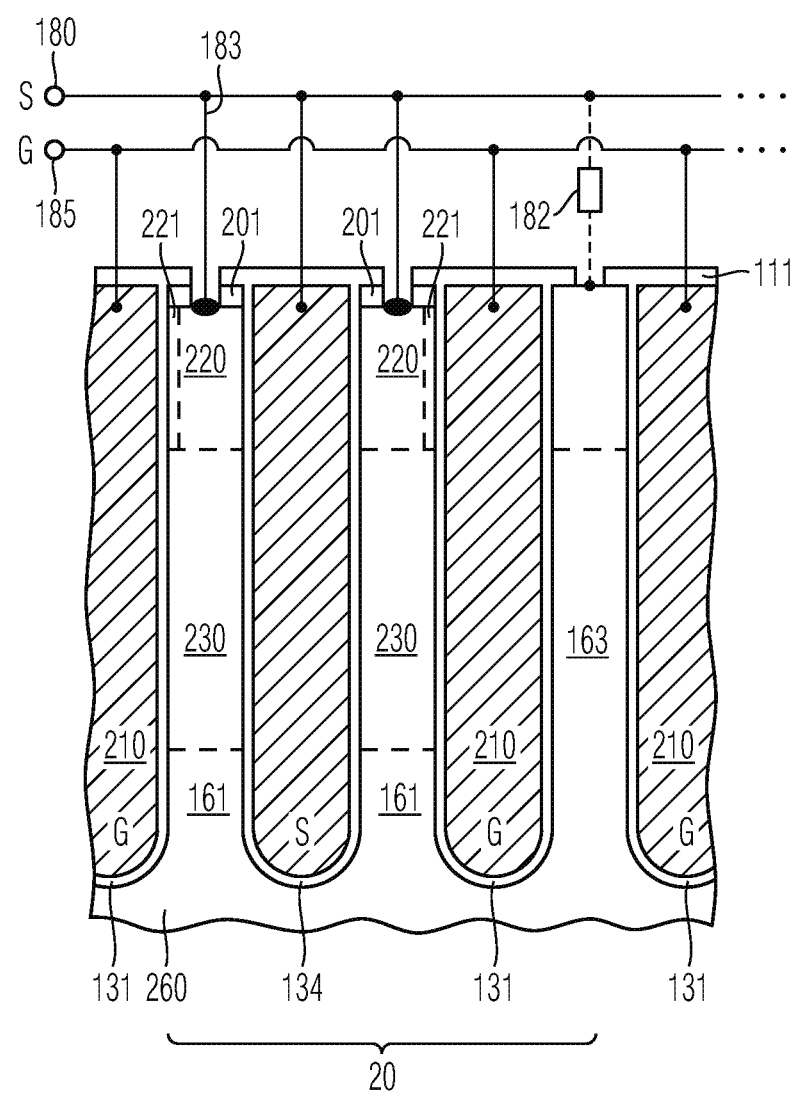
FIG. 6A shows a cross-sectional view of a portion of a semiconductor device according to examples.

FIG. 6A shows a cross-sectional view of a portion of the semiconductor device. The transistor 20 comprises a source trench 134 and two active trenches 131. The transistor 20 further comprises two first mesas 161 and a dummy mesa 163. The first mesas 161 are arranged between the source trench 134 and a corresponding one of the active trenches 131, respectively. The dummy mesa 163 is arranged between the two active trenches 131. The barrier region is arranged in the first mesas 161 and is absent from the dummy mesa 163. For example, an insulation layer 111 may be arranged over the semiconductor material. This semiconductor device shows an improved controllability of the switching speed. Since a source trench 134 is arranged adjacent to the first mesas 161, a one-sided channel 221 of the transistor is configured to be formed in the first mesas, respectively.

Figure 6B:
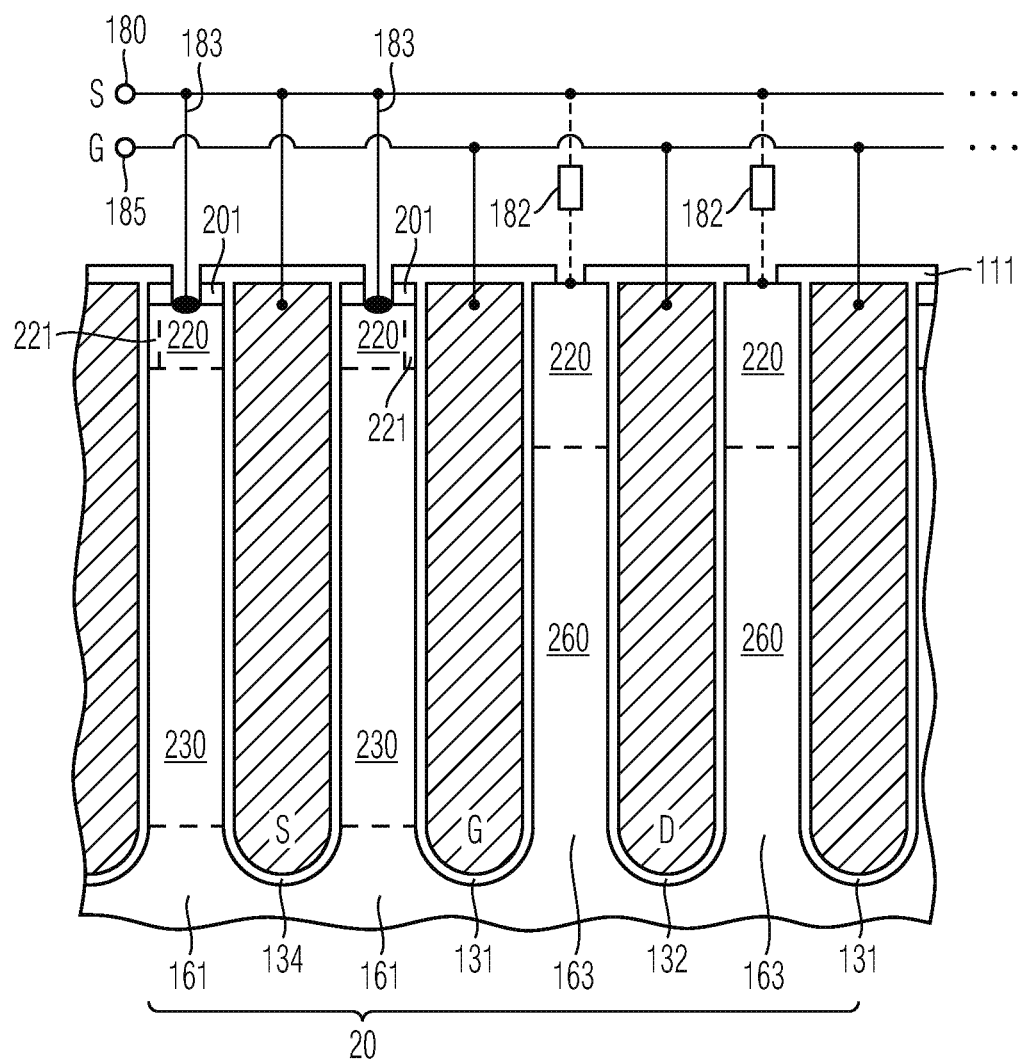
FIG. 6B is a cross-sectional view of a portion of a semiconductor device according to a further example.

FIG. 6B shows a cross-sectional view of a portion of the semiconductor device according to further embodiments. The transistor 20 comprises two first mesas 161 comprising a barrier region 230, respectively, followed by two dummy mesas 163. The transistor 20 further comprises four trenches filled with a conductive material that is electrically connected to the gate terminal 185. Three of the trenches implement gate trenches 131. One of trenches adjacent to a dummy mesa on either side thereof implements a dummy trench 132. The barrier region 230 is arranged in the first mesas 161. Since a source trench 134 is arranged adjacent to the first mesas 161, a one-sided channel 221 of the transistor is configured to be formed in the first mesas, respectively.

Figure 6C:
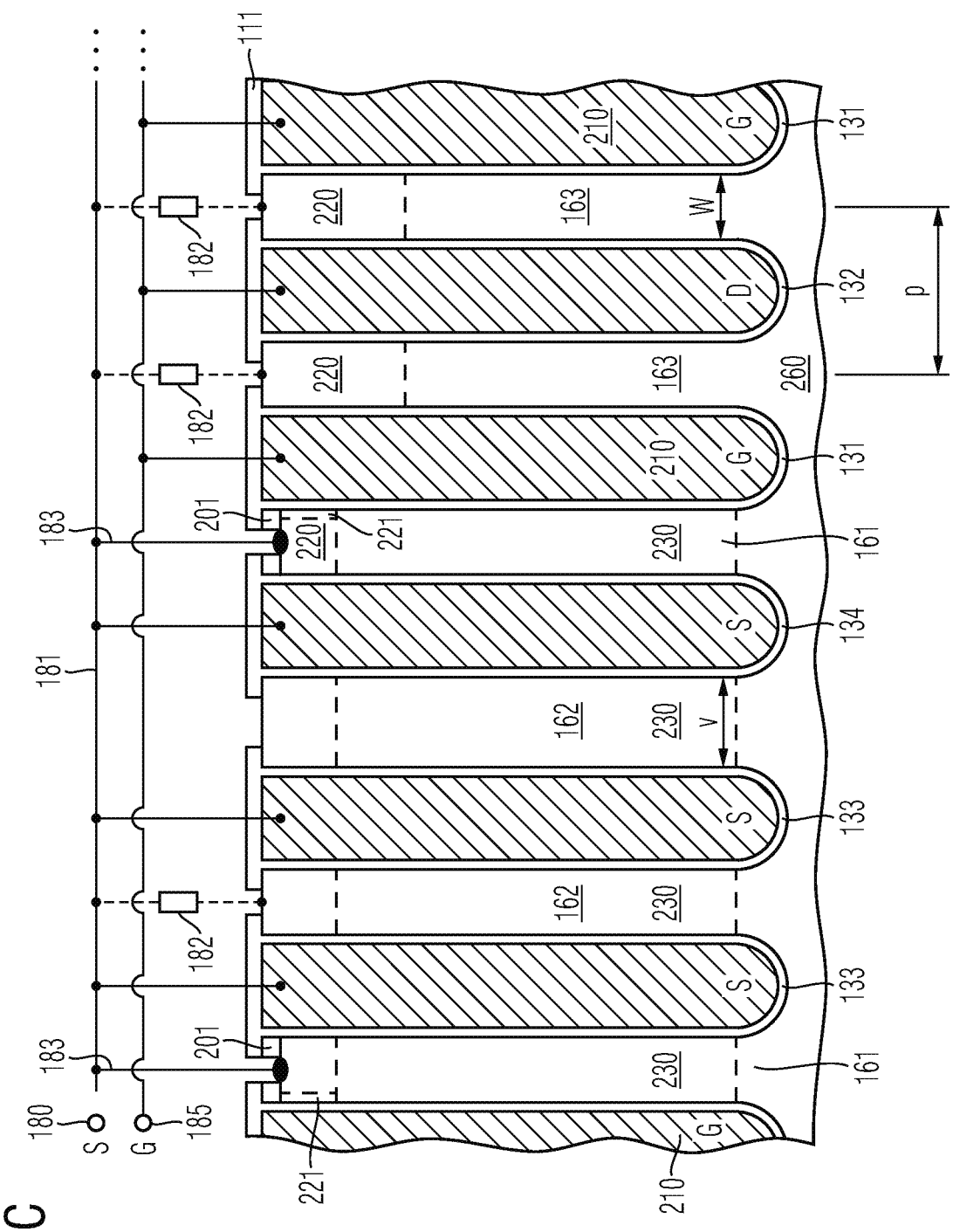
FIG. 6C is a cross-sectional view of a semiconductor device according to further examples.

FIG. 6C shows a cross-sectional view of a semiconductor device according to further embodiments. According to the embodiments shown in FIG. 6C, a transistor 20 comprises a first mesa 161 and three source trenches 133 that are arranged adjacent to each other, a further first mesa 161 and three gate trenches 131, 132. Dummy mesas 163 may be arranged between adjacent ones of the gate trenches. In this case, the second gate trench may implement a dummy trench 132. The first and second gate trenches implement active trenches 131, respectively. Further, dummy mesas 163 are arranged between adjacent ones of the source trenches 133. In more detail, first mesas are arranged between a source trench 133 and a gate trench 131. Further, dummy mesas 163 are arranged between adjacent ones of source trenches or between adjacent ones of gate trenches. The barrier region 230 is disposed in any of the mesas adjacent to a source trench 133. Further, the barrier region 230 is absent from mesas that are not adjacent to a source trench 133 or, differently stated from mesas being arranged between two adjacent gate trenches.

Since a source trench 134 is arranged adjacent to the first mesa 161, a one-sided channel 221 of the transistor is configured to be formed in the first mesa 161.

According to a different interpretation, the semiconductor device illustrated in FIG. 6C comprises a transistor. The transistor comprises a drift region of a first conductivity type in a semiconductor substrate having a first main surface. The transistor further comprises a body region 220 of a second conductivity type between the drift region and the first main surface. The transistor comprises a plurality of trenches in the first main surface. The trenches pattern the semiconductor substrate into a plurality of mesas comprising a first mesa 161. The plurality of trenches comprise an active trench 131 and a first and a second source trenches 133, 134. A conductive material in the first and second source trenches is electrically connected to a source terminal 180. The transistor comprises a gate electrode 210 in the active trench 131 and a source region 201 of the first conductivity type in the first mesa 161. The first mesa 161 is arranged adjacent to the active trench 131. The transistor further comprises a second mesa 162 arranged in contact with the first and second source trenches 133, 134. The transistor additionally comprises a barrier region 230 of the first conductivity type at a higher doping concentration than the doping concentration of the drift region 260. The barrier region 230 is arranged between the body region 220 and the drift region 260, the barrier region 230 being arranged in the second mesa 162. The plurality of mesas further comprise two dummy mesas 163 and a dummy trench 132. The dummy mesas 163 are arranged on either sides of the dummy trench 132. Further, the dummy mesas 163 contact the dummy trench 132.

According to embodiments, the trenches may be arranged at a regular pitch p. According to further embodiments, as is illustrated in FIG. 6C, the trenches may be arranged at varying distances thereby providing different widths v, w of the mesa. Generally, according to embodiments, the width of the mesa, e.g. the first mesa or the dummy mesa, may be less than 4 µm, e.g. less than 1 µm, e.g. less than 700 nm or even less than 500 nm. For example, the width of the dummy mesa may be set in dependence from the functionality of the dummy mesa. By way of example, if there is a contact to the dummy mesa, a small width of the dummy mesa may be set. In cases in which the dummy mesa acts as a diode, a larger width of the mesa may be selected.

Figure 6D:
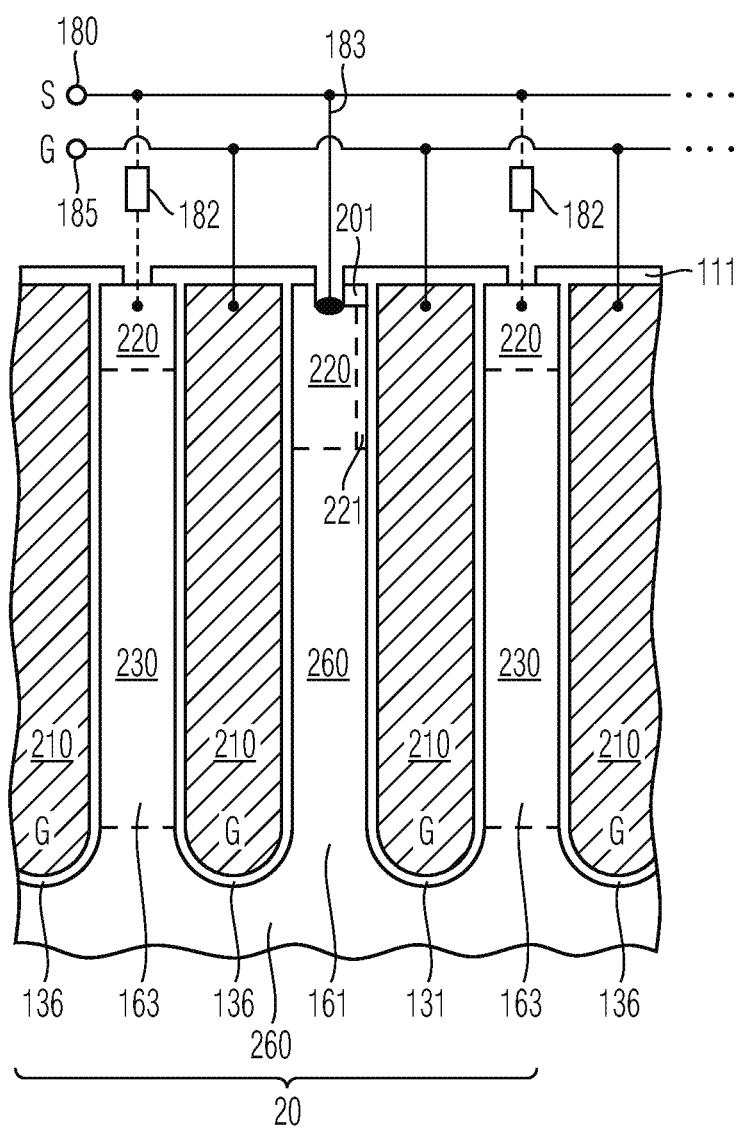
FIG. 6D is a cross-sectional view of a semiconductor device according to examples.

FIG. 6D shows a cross-sectional view of the portion of a semiconductor device according to further embodiments. According to FIG. 6D, a transistor 20 comprises two dummy mesas 163 and one first mesa 161. Further, some of the trenches are implemented as active trenches 131 comprising a gate electrode 210. The first mesa 161 is arranged between two dummy mesas 163. The first mesas 161 comprise a source region 201 and are electrically connected to the source terminal 180. According to embodiments, a one-sided channel 221 of the transistor is configured to be formed in the first mesa 161. The dummy mesas 163 are, e.g. connected via a resistor element 182 to the source terminal 180 or are disconnected from the source terminal. The barrier region 230 is disposed in the dummy mesas 163 and is absent from the first mesas 161. For this configuration an improved controllability of the switching speed may be achieved. Further trenches may be implemented as gate trenches 136 comprising a gate electrode, wherein a conductive channel may not be formed adjacent to any sidewall of the gate trench 136. According to further examples, conductive channels are configured to be formed at both sidewalls of the first mesa 161.

Figure 6E:
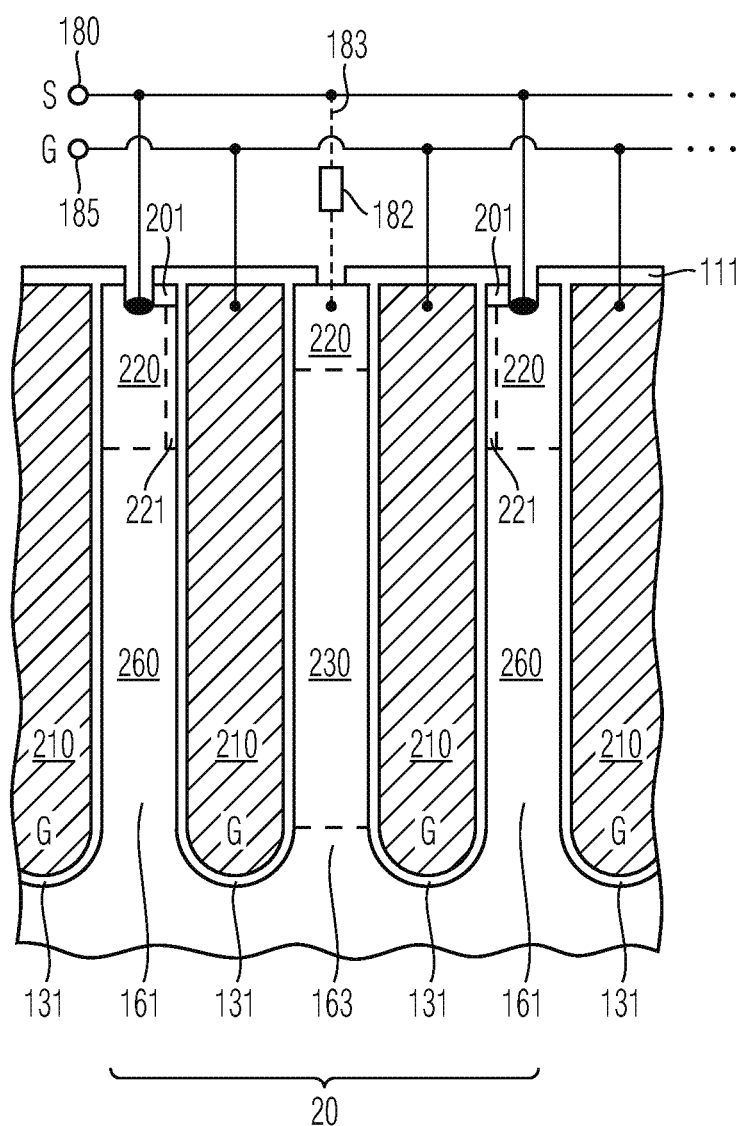
FIG. 6E is a cross-sectional view of a semiconductor device according to further examples.

FIG. 6E shows a cross-sectional view of a portion of the semiconductor device according to further embodiments. According to these embodiments, the transistor comprises two first mesas 161 and one dummy mesa 163. The dummy mesa 163 is arranged between the first mesas 161 to form a symmetric arrangement. Some of the trenches are implemented as active trenches 131 including a gate electrode 210. Further trenches may be implemented as gate trenches 136 comprising a gate electrode. The barrier region 230 is arranged in the dummy mesa 163 and is absent from the first mesas 161. A one-sided channel 221 of the transistor is configured to be formed in the first mesa. For example, the source region 201 may be formed adjacent to only one of the sidewalls of the first mesa 161. According to further examples, conductive channels are configured to be formed at both sidewalls of the first mesa 161.

Figure 6F:
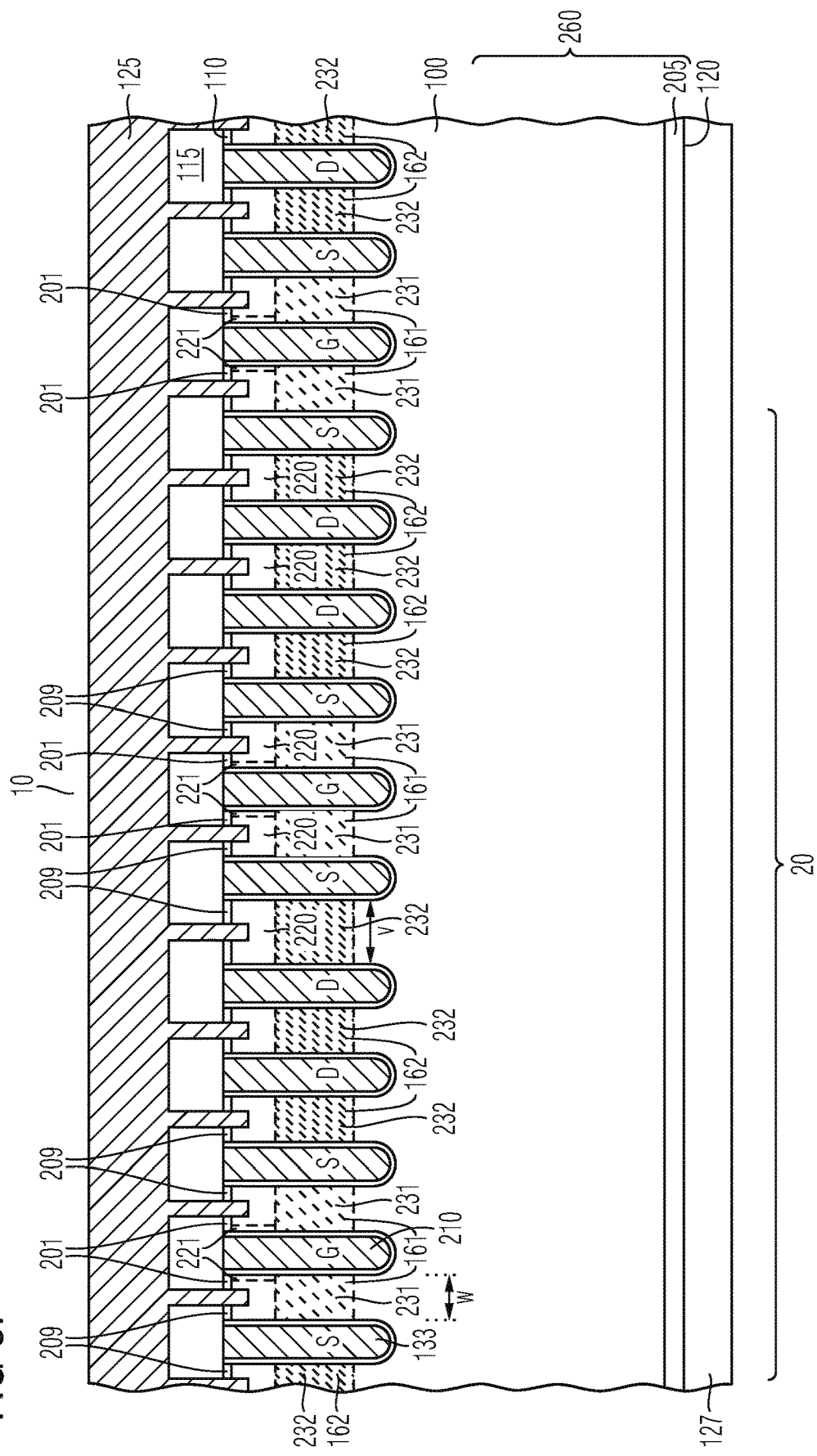
FIG. 6F is a cross-sectional view of a semiconductor device according to further examples.

FIG. 6F shows a cross-sectional view of a semiconductor device according to further embodiments. The device shown in FIG. 6F is based on the device shown in FIG. 4 comprising a first barrier region 231 and a second barrier region 232.

The semiconductor device 10 shown in FIG. 6F comprises a transistor 20. The transistor comprises a drift region 260 of a first conductivity type in a semiconductor substrate 100 having a first surface 110. The transistor further comprises a body region 220 of a second conductivity type between the drift region 260 and the first main surface 110. The transistor comprises a plurality of trenches 131, 133. The trenches pattern the semiconductor substrate 100 into a plurality of mesas 161, 162. For example, the plurality of mesas may comprise first mesas 161 and second mesas 162. The plurality of trenches comprise an active trench 131 and a source trench 133. A gate electrode 210 is arranged in the active trench 131. A conductive material of the source trench 133 is electrically connected with the source terminal 180. A source region 201 of the first conductivity type is arranged in the first mesa 161. The first mesa 161 is arranged adjacent to the active trench 131. For example, the source region 201 is arranged adjacent to the active trench 131. The transistor 20 further comprises a first barrier region 231 and a second barrier region 232. A doping concentration of the first barrier region 231 may be different from the doping concentration of the second barrier region 232.

As is illustrated in FIG. 6F, for example, the first barrier region 231 may be arranged in adjacent first mesas 161. Further, the second barrier region 232 may be arranged in adjacent second mesas 162. For example, the second mesas may be dummy mesas in the manner as has been defined above. Accordingly, the trenches arranged between adjacent dummy mesas 162 may implement dummy trenches. For example, the dummy trenches may be electrically connected to a gate terminal. Further, a one-sided channel 221 of the transistor is configured to be formed in the first mesas 161. For example, source trenches 133 may be arranged on either sides of gate trench 131. Further, two or more dummy trenches may be arranged between neighboring source trenches 133. First mesas 231 may be arranged between neighboring source trenches 133 so as to be adjacent to an active trench 131. Further, dummy mesas 162 may be arranged on the other side of the respective source trenches 133. A width w of the first mesa 231 may be different form a width v of the second mesa 232.

For example, a doping concentration of the first barrier region 231 in the first mesa 161 may be larger than a doping concentration of the second barrier region 232 in the second mesa 162, e.g. a dummy mesa. For example, in this case, there may be a smaller feedback due to electrons from the dummy mesa during switching. To be more specific, the smaller the doping concentration, the smaller is the feedback due to electrons. As a result, the controllability of the device may be improved.

Doped portions 209 of the second conductivity may be arranged in the first mesas 161 and in the second mesas 162 at a position adjacent to the first main surface 110 of the semiconductor substrate. The doped portion 209 may be adjacent to the source trenches 133 or to the dummy trenches.

According to an alternative interpretation, the semiconductor device 10 shown in FIG. 6F comprises a transistor 20. The transistor 20 comprises a drift region 260 of a first conductivity type in a semiconductor substrate 100 having a first main surface 110. The transistor further comprises a body region 220 of a second conductivity type between the drift region 260 and the first main surface 110. The transistor comprises a plurality of trenches 130 in the first main surface, the trenches patterning the semiconductor substrate 100 into a plurality of mesas comprising a first mesa 161 and a dummy mesa 162. The plurality of trenches comprise at least one active trench 131, wherein the first mesa 161 is arranged at a first side of the active trench 231. The dummy mesa 162 is arranged at a second side of the active trench. The transistor further comprises a gate electrode 210 arranged in the active trench 231, and a source region 201 of the first conductivity type in the first mesa 161. A one-sided channel 221 of the transistor 20 is configured to be formed in the first mesa 161.

A back side metal layer 127 may be arranged adjacent to a second main surface 120 of the semiconductor substrate 100. A back side region 205 of the second conductivity type, e.g. a p-emitter region may be formed in the semiconductor substrate 100 at the second main surface. The source regions 201 of the respective first mesas may be electrically connected by a conductive layer 125 arranged at a first main surface 110 of the semiconductor substrate 100. As is illustrated, an insulating material 115 may be arranged to provide electric isolation.

The elements explained with reference to FIGS. 1A to 6E may be further modified as will be illustrated with reference to FIGS. 7A to 7B. For example, embodiments of a semiconductor device may be implemented in a manner so as to omit certain ones of the trenches 130. For example, the semiconductor device shown in FIG. 7A comprises gate trenches 131, a source trench 133 and a dummy trench 132. Instead of a further trench between the source trench 133 and a dummy trench 132, a doped portion 138 of the first conductivity type is disposed between the source trench 133 and the dummy trench 132. Accordingly, the transistor 20 comprises an active trench 131, a source trench 133 and a dummy trench 132. A conductive filling in the dummy trench 132 may be, for example, electrically connected to the gate terminal 185. A first mesa 161 is arranged between the active trench 131 and the source trench 133. Dummy mesas and the doped portion 138 are disposed between the source trench 133 and the dummy trench 132. Further, a dummy mesa 163 is arranged between the dummy trench 132 and the active trench 131 at the right-hand side of the drawing. For example, the first mesa 161 on the other side of this active trench 131 is implemented in a manner that a one-sided channel 221 of the transistor is configured to be formed in this mesa. The barrier region 230 is arranged in the first mesas 161 and is absent from the portion between the source trench 133 and the dummy trench 132. Further, the barrier is absent from the portion between the dummy trench 132 and the active trench 131. An insulation layer 111 may be arranged over the semiconductor material.

According to embodiments illustrated in FIG. 7B, the trenches may comprise a floating trench 135. The conductive material in the floating trench 135 may be disconnected from a terminal and is held in a floating state. According to embodiments, within the context of the present specification, the term "floating trench" is intended to further comprise a trench having a conductive filling that is electrically connected to a corresponding terminal via a high-ohmic connection. For example, an electric resistance of the conductive filling to the corresponding terminal may be larger than the electric resistance of the gate electrode to a gate terminal. A dummy mesa 163 may be arranged on either side of the floating trench 135. For example, the transistor 20 shown in FIG. 7B may comprise gate trenches 131, a source trench 134, a floating trench 135 and a dummy trench 132. A first mesa 161 may be arranged between the active trench 131 and the source trench 134. Further, dummy mesas 163 may be arranged between the source trench 134 and the floating trench 135, between the floating trench 135 and the dummy trench 132 and between the dummy trench 132 and the active trench 131. As is illustrated, a further active trench 131 may be arranged adjacent to a right-hand side of the dummy trench 132, followed by a first mesa 161. This first mesa 161 may be implemented in a manner so that a one-sided channel 221 of the transistor is configured to be formed in the first mesa 161. For example, the barrier region 230 may be arranged in the first mesa 161 and may be absent from the dummy mesas 163.

FIG. 7C shows a portion of a semiconductor device that implements the structure that has been explained above with reference to FIG. 2. The transistor 20 comprises a first mesa 161 and a plurality of dummy mesas 163. The barrier region 230 may be arranged in the dummy mesas 163 which may be adjacent to dummy trenches 132. The dummy trench 132 may be implemented in the manner as has been explained above with reference to FIG. 2.

The barrier region 230 may be absent from first mesas 161 and from mesas arranged between adjacent source trenches.

FIG. 7D shows a portion of a semiconductor device implementing the structure that has been explained with reference to FIGS. 3A to 3C. As is shown, a transistor 20 comprises dummy trenches 132, first source trenches 133, second source trenches 134 and gate trenches 131. For example, one of the corresponding transistor cells 201 comprises exactly one gate trench 131. The barrier region may be arranged in a first mesa 161 and may be arranged in a second mesa 162 which is disposed between source trenches 133, 134. For example, the barrier region 230 may be absent from dummy mesas 163 which are not arranged between two source trenches 133, 134.

Figure 8:
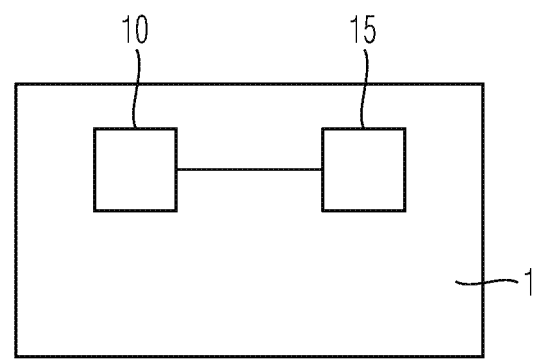
FIG. 8 shows a schematic view of an electric device according to one or more embodiments.

FIG. 8 shows a schematic view of an electric device 1 comprising the semiconductor device 10 which has been discussed above. The electric device 1 shown in FIG. 8 comprises the semiconductor device 10 and an element 15 connected to the semiconductor device. For example, the element 15 may be a motor or may be a logic circuit. For example, the electric device 1 shown in FIG. 8 may be a motor drive or a power module in which a semiconductor device 10 and a logic circuit are arranged on a single circuit board. For example, the element 15 may be controlled by the semiconductor device 10, e.g. by switching. Due to the improved controllability of the switching speed, as explained above, the element 15 may be controlled in an improved manner, improving the lifetime and the performance of the electric device 1.

While embodiments have been described above, it is obvious that further embodiments may be implemented. For example, further embodiments may comprise any subcombination of features recited in the claims or any subcombination of elements described in the examples given above. Accordingly, this spirit and scope of the appended claims should not be limited to the description of the embodiments contained herein.

What is claimed is:

1. A semiconductor device comprising a transistor, the transistor comprising:
    a drift region of a first conductivity type in a semiconductor substrate having a first main surface;
    a body region of a second conductivity type between the drift region and the first main surface;
    a plurality of trenches in the first main surface and patterning the semiconductor substrate into a plurality of mesas comprising a first mesa, the plurality of trenches comprising an active trench, a first source trench and a second source trench, wherein a conductive material in the first and second source trenches is electrically connected to a source terminal;
    a gate electrode arranged in the active trench;
    a source region of the first conductivity type in the first mesa, the first mesa being arranged adjacent to the active trench;
    a second mesa between the first and second source trenches, the second mesa being in contact with at least one of the first and the second source trenches; and
    a barrier region of the first conductivity type at a higher doping concentration than the doping concentration of the drift region,
    wherein the barrier region is arranged between the body region and the drift region in the second mesa.

2. The semiconductor device of claim 1, wherein the plurality of trenches further comprises a dummy trench between the first and second source trenches, and wherein dummy mesas are arranged on either sides of the dummy trench.

3. The semiconductor device of claim 2, wherein a conductive material in the dummy trench is electrically connected to the source terminal.

4. The semiconductor device of claim 1, wherein a width of the first mesa is less than 1 µm.

5. The semiconductor device of claim 1, wherein the first mesa is arranged between the active trench and the first source trench.

6. The semiconductor device of claim 1, wherein a ratio between the doping concentration of the barrier region and the doping concentration of the drift region is in a range of 100 to 10000.

7. The semiconductor device of claim 6, wherein the doping concentration of the drift region varies, and wherein the ratio is a ratio between the doping concentration of the barrier region and a highest doping concentration of the drift region.

8. The semiconductor device of claim 1, wherein the barrier region is arranged in direct contact with the drift region.

9. The semiconductor device of claim 8, wherein an interface between the barrier region and the drift region forms a junction between portions of identical doping types having different doping concentrations.

10. The semiconductor device of claim 1, wherein the barrier region is patterned.

11. The semiconductor device of claim 1, wherein the barrier region extends from one sidewall of the second mesa to another sidewall of the second mesa in a horizontal direction.

12. A semiconductor device comprising a transistor, the transistor comprising:
    a drift region of a first conductivity type in a semiconductor substrate having a first main surface;
    a body region of a second conductivity type between the drift region and the first main surface;
    a plurality of trenches in the first main surface and patterning the semiconductor substrate into a plurality of mesas comprising a first mesa, the plurality of trenches comprising an active trench, a first source trench and a second source trench, wherein a conductive material in the first and second source trenches is electrically connected to a source terminal;
    a gate electrode arranged in the active trench;
    a source region of the first conductivity type in the first mesa, the first mesa being arranged adjacent to the active trench;
    a second mesa between the first and second source trenches, the second mesa being in contact with at least one of the first and the second source trenches; and
    a barrier region of the first conductivity type at a higher doping concentration than the doping concentration of the drift region,
    wherein the barrier region is arranged between the body region and the drift region in the first mesa.

13. The semiconductor device of claim 12, further comprising:
    an additional barrier region of the first conductivity type at a higher doping concentration than the doping concentration of the drift region,
    wherein the additional barrier region is arranged between the body region and the drift region in the second mesa.

14. The semiconductor device of claim 13, wherein the additional barrier region in the second mesa has a lower doping concentration than the barrier region in the first mesa.

15. The semiconductor device of claim 13, wherein the second mesa is devoid of a source region of the first conductivity type.

16. The semiconductor device of claim 12, wherein the second mesa is devoid of a barrier region of the first conductivity type at a higher doping concentration than the doping concentration of the drift region.

17. A semiconductor device comprising a transistor, the transistor comprising:

a drift region of a first conductivity type in a semiconductor substrate having a first main surface;

a body region of a second conductivity type between the drift region and the first main surface;

a plurality of trenches in the first main surface and patterning the semiconductor substrate into a plurality of mesas comprising a first mesa and a plurality of dummy mesas, the plurality of trenches comprising an active trench and a plurality of dummy trenches arranged in a row;

a gate electrode arranged in the active trench; and a source region of the first conductivity type in the first mesa, wherein the first mesa is arranged adjacent to the active trench, wherein a dummy mesa is arranged between each adjacent pair of the dummy trenches, wherein the dummy mesas do not carry load current during an on-state of the transistor.

18. The semiconductor device of claim 17, wherein a conductive material in the plurality of dummy trenches is electrically connected to a source terminal or a gate terminal.

19. The semiconductor device of claim 17, wherein the plurality of dummy trenches comprises at least three dummy trenches arranged adjacent to each other.

20. The semiconductor device of claim 17, further comprising:

a barrier region of the first conductivity type at a higher doping concentration than the doping concentration of the drift region, wherein the barrier region is arranged between the body region and the drift region in the dummy mesas.

* * * * *